(12) United States Patent
Jones et al.

(10) Patent No.: US 8,130,057 B2
(45) Date of Patent: Mar. 6, 2012

(54) LUMPED CROSS-COUPLED WILKINSON CIRCUIT

(75) Inventors: David E. Jones, Cedar Rapids, IA (US); Kevin M. Hoheisel, Hiawatha, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 351 days.

(21) Appl. No.: 12/433,377

(22) Filed: Apr. 30, 2009

(65) Prior Publication Data

US 2011/0063045 A1     Mar. 17, 2011

Related U.S. Application Data

(60) Provisional application No. 61/049,248, filed on Apr. 30, 2008.

(51) Int. Cl.
*H01P 5/12* (2006.01)
*H03H 7/38* (2006.01)

(52) U.S. Cl. ......... 333/131; 333/126; 333/129; 333/132

(58) Field of Classification Search .......... 333/126–129, 333/131, 132, 134
See application file for complete search history.

(56) References Cited

U.S. PATENT DOCUMENTS

| | | | | |
|---|---|---|---|---|
| 3,735,289 | A | * | 5/1973 | Bruene ............................ 333/5 |
| 6,954,623 | B2 | | 10/2005 | Chang et al. |
| 2006/0290444 | A1 | | 12/2006 | Chen |
| 2010/0007433 | A1 | * | 1/2010 | Jensen .......................... 333/132 |

OTHER PUBLICATIONS

Pampichai, Samphan et al., "A 3-dB Lumped-Distributed Miniaturized Wilkinson Divider," Elecrical Engineering Conference (EECON-23), pp. 329-332, Nov. 2000.
Noriega, Fernando et al., "Designing LC Wilkinson power splitters," RF interconnects/interfaces, Aug. 2002, pp. 18-24, rfdesign.com.

* cited by examiner

*Primary Examiner* — Robert Pascal
*Assistant Examiner* — Kimberly Glenn
(74) *Attorney, Agent, or Firm* — Withrow & Terranova, P.L.L.C.

(57) ABSTRACT

The present invention relates to a lumped cross-coupled Wilkinson circuit having a pair of magnetically cross-coupled inductive elements coupled to an isolation network. By magnetically cross-coupling the inductive elements, which have a mutual inductance, the inductance of each inductive element will be significantly less than the inductance of each inductive element in an equivalent lumped traditional Wilkinson combiner. Since the inductance of each inductive element is less, the size of each inductive element may be significantly smaller and the resistive loss of the each inductive element may be significantly smaller. In one embodiment of the present invention, the lumped cross-coupled Wilkinson circuit operates as a lumped cross-coupled Wilkinson combiner. In an alternate embodiment of the present invention, the lumped cross-coupled Wilkinson circuit operates as a lumped cross-coupled Wilkinson splitter.

22 Claims, 22 Drawing Sheets

LUMPED CROSS-COUPLED WILKINSON CIRCUIT

This application claims the benefit of provisional patent application Ser. No. 61/049,248, filed Apr. 30, 2008, the disclosure of which is hereby incorporated herein by reference in its entirety.

FIELD OF THE INVENTION

Embodiments of the present invention relate to lumped Wilkinson combiners and splitters, which may be used in radio frequency (RF) communications circuits.

BACKGROUND OF THE INVENTION

Wilkinson combiners are used to combine two alternating current (AC) signals with a combined AC signal, whereas Wilkinson splitters are used to split an AC signal into two AC signals. Some Wilkinson combiners may be used as Wilkinson splitters, and vice versa. FIG. 1 shows a lumped traditional Wilkinson combiner 10 according to the prior art. The lumped traditional Wilkinson combiner 10 may include a first port FP and a second port SP for receiving a first AC signal $V_{AC1}$ and a second AC signal $V_{AC2}$, respectively, and a common port CP for providing a combined AC signal $V_{CMB}$, which is based on combining the first AC signal $V_{AC1}$ and the second AC signal $V_{AC2}$. At certain frequencies and in certain circuit arrangements, the lumped traditional Wilkinson combiner 10 may provide impedance matching at the first port FP, the second port SP, and the common port CP, and may provide isolation between the first port FP and the second port SP. Such behaviors may be useful in RF circuits, such as quadrature RF circuits, which may split a single signal into two quadrature signals, combine two quadrature signals into a single signal, or both. A traditional Wilkinson combiner 10 may include transmission line elements to achieve the desired impedance matching and isolation behaviors. The lumped traditional Wilkinson combiner 10 may use lumped elements instead of transmission line elements to achieve behaviors that are similar to a transmission line based traditional Wilkinson combiner.

FIG. 2 shows details of the lumped traditional Wilkinson combiner 10 illustrated in FIG. 1. The lumped traditional Wilkinson combiner 10 includes a first inductive element L1 coupled between the first port FP and the common port CP, a second inductive element L2 coupled between the second port SP and the common port CP, an isolation resistive element $R_{ISO}$ coupled between the first port FP and the second port SP, a first isolation capacitive element $C_{ISO1}$ coupled between the first port FP and ground, a second isolation capacitive element $C_{ISO2}$ coupled between the second port SP and ground, and an impedance matching capacitive element $C_M$ coupled between the common port CP and ground. The first port FP and the second port SP receive the first AC signal $V_{AC1}$ and the second AC signal $V_{AC2}$, respectively, and the common port CP provides the combined AC signal $V_{CMB}$. The first AC signal $V_{AC1}$ provides a first AC current $I_1$ and the second AC signal $V_{AC2}$ provides a second AC current $I_2$.

Typically, a magnitude of an inductance of the first inductive element L1 is about equal to a magnitude of an inductance of the second inductive element L2, and a magnitude of a capacitance of the first isolation capacitive element $C_{ISO1}$ is about equal to a magnitude of a capacitance of the second isolation capacitive element $C_{ISO2}$. Therefore, the lumped traditional Wilkinson combiner 10 may be symmetrical and the first port FP and the second port SP may be interchangeable. The isolation resistive element $R_{ISO}$, the first isolation capacitive element $C_{ISO1}$, and the second isolation capacitive element $C_{ISO2}$ form an isolation network. The first inductive element L1 and the second inductive element L2 provide phase shift, and the impedance matching capacitive element $C_M$ may help provide impedance matching and isolation.

The lumped traditional Wilkinson combiner 10 may be used in a quadrature RF amplifier circuit to combine quadrature RF signals into a single transmit signal that is fed to an antenna. Such an amplifier circuit may be used in portable wireless devices, such as cell phones, wireless local area network (WLAN) modems, or the like. Such devices may be compact and battery powered; therefore, the lumped traditional Wilkinson combiner 10 may need to be small and efficient. However, the first and the second inductive elements L1, L2 may need to have relatively large inductances for proper operation. The larger inductances require more area and have larger resistive losses. Thus, there is a need for a lumped Wilkinson combiner to have small and efficient inductive elements.

SUMMARY OF THE EMBODIMENTS

The present invention relates to a lumped cross-coupled Wilkinson circuit having a pair of magnetically cross-coupled inductive elements coupled to an isolation network. By magnetically cross-coupling the inductive elements, which have a mutual inductance, the inductance of each inductive element may be significantly less than the inductance of each inductive element in an equivalent lumped traditional Wilkinson combiner. Since the inductance of each inductive element is less, the size of each inductive element may be significantly smaller and the resistive loss of each inductive element may be significantly smaller. In one embodiment of the present invention, the lumped cross-coupled Wilkinson circuit operates as a lumped cross-coupled Wilkinson combiner. In an alternate embodiment of the present invention, the lumped cross-coupled Wilkinson circuit operates as a lumped cross-coupled Wilkinson splitter.

The lumped cross-coupled Wilkinson combiner may be used to combine quadrature RF signals, which have been phase-aligned, into a combined RF signal. The quadrature RF signals may be provided by a quadrature RF power amplifier and the combined RF signal may be fed to antenna circuitry. The lumped cross-coupled Wilkinson splitter may be used to split a common RF signal into two signals that are then phase-shifted from one another to provide quadrature RF signals. In one embodiment of the present invention, the lumped cross-coupled Wilkinson combiner may include an impedance matching network.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a lumped cross-coupled Wilkinson circuit having a pair of magnetically cross-coupled inductive elements coupled to an isolation network. By magnetically cross-coupling the inductive elements, which have a mutual inductance, the inductance of each inductive element will be significantly less than the inductance of each inductive element in an equivalent lumped traditional Wilkinson combiner. Since the inductance of each inductive element is less, the size of each inductive element may be significantly smaller and the resistive loss of each inductive element may be significantly smaller. In one embodiment of the present invention, the lumped cross-coupled Wilkinson circuit operates as a lumped cross-coupled Wilkinson combiner. In an alternate embodiment of the present invention, the lumped cross-coupled Wilkinson circuit operates as a lumped cross-coupled Wilkinson splitter.

The lumped cross-coupled Wilkinson combiner may be used to combine quadrature RF signals, which have been phase-aligned, into a combined RF signal. The quadrature RF signals may be provided by a quadrature RF power amplifier and the combined RF signal may be fed to antenna circuitry. The lumped cross-coupled Wilkinson splitter may be used to split a common RF signal into two signals that are then phase-shifted from one another to provide quadrature RF signals. In one embodiment of the present invention, the lumped cross-coupled Wilkinson combiner may include an impedance matching network.

Figure 1:
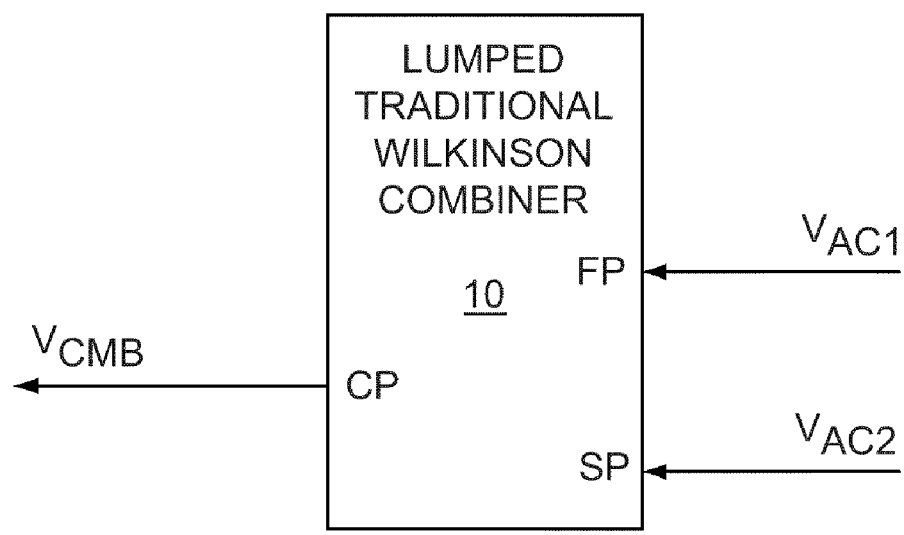
FIG. 1 shows a lumped traditional Wilkinson combiner according to the prior art.
Figure 2:
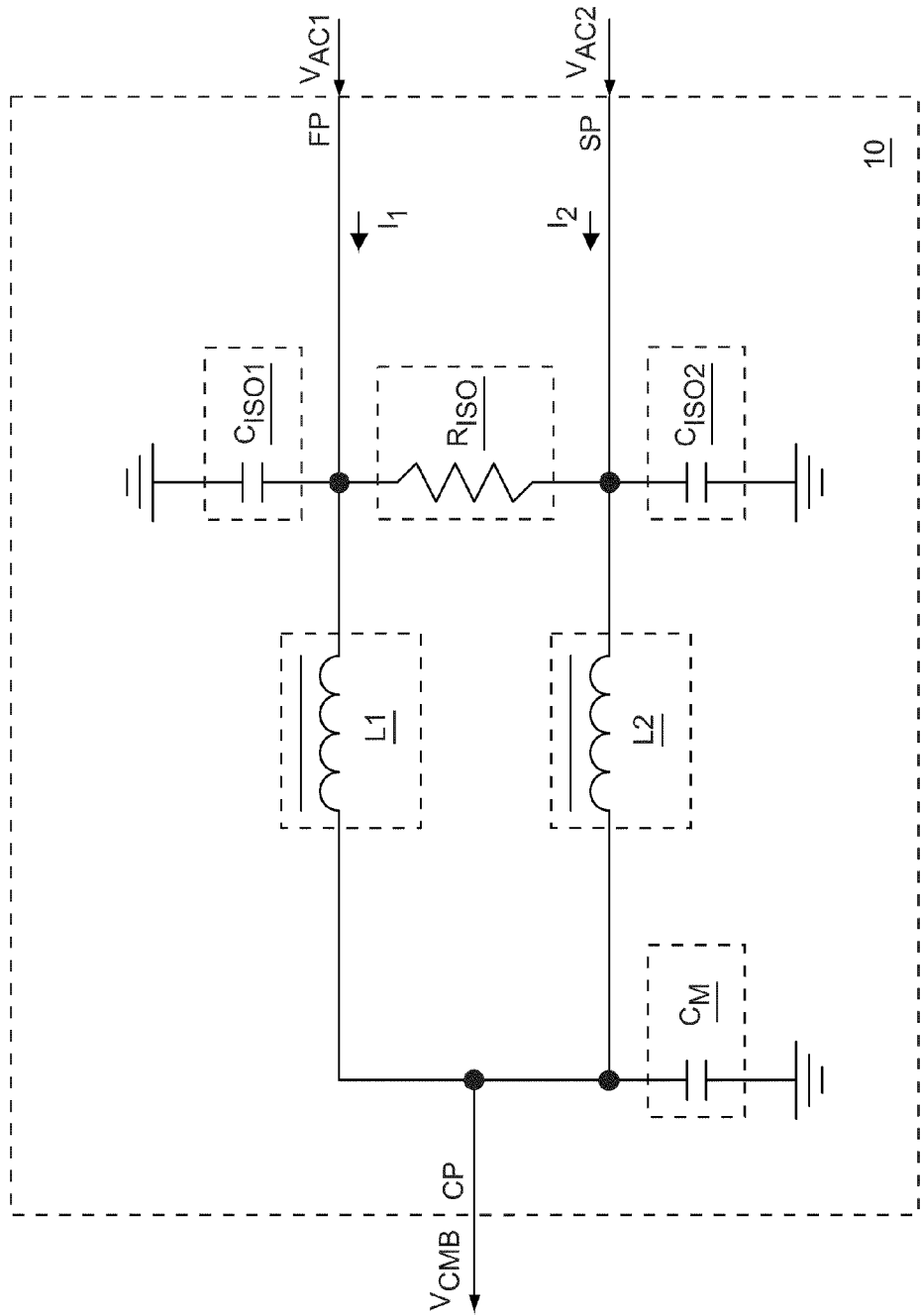
FIG. 2 shows details of the lumped traditional Wilkinson combiner illustrated in FIG. 1.
Figure 3:
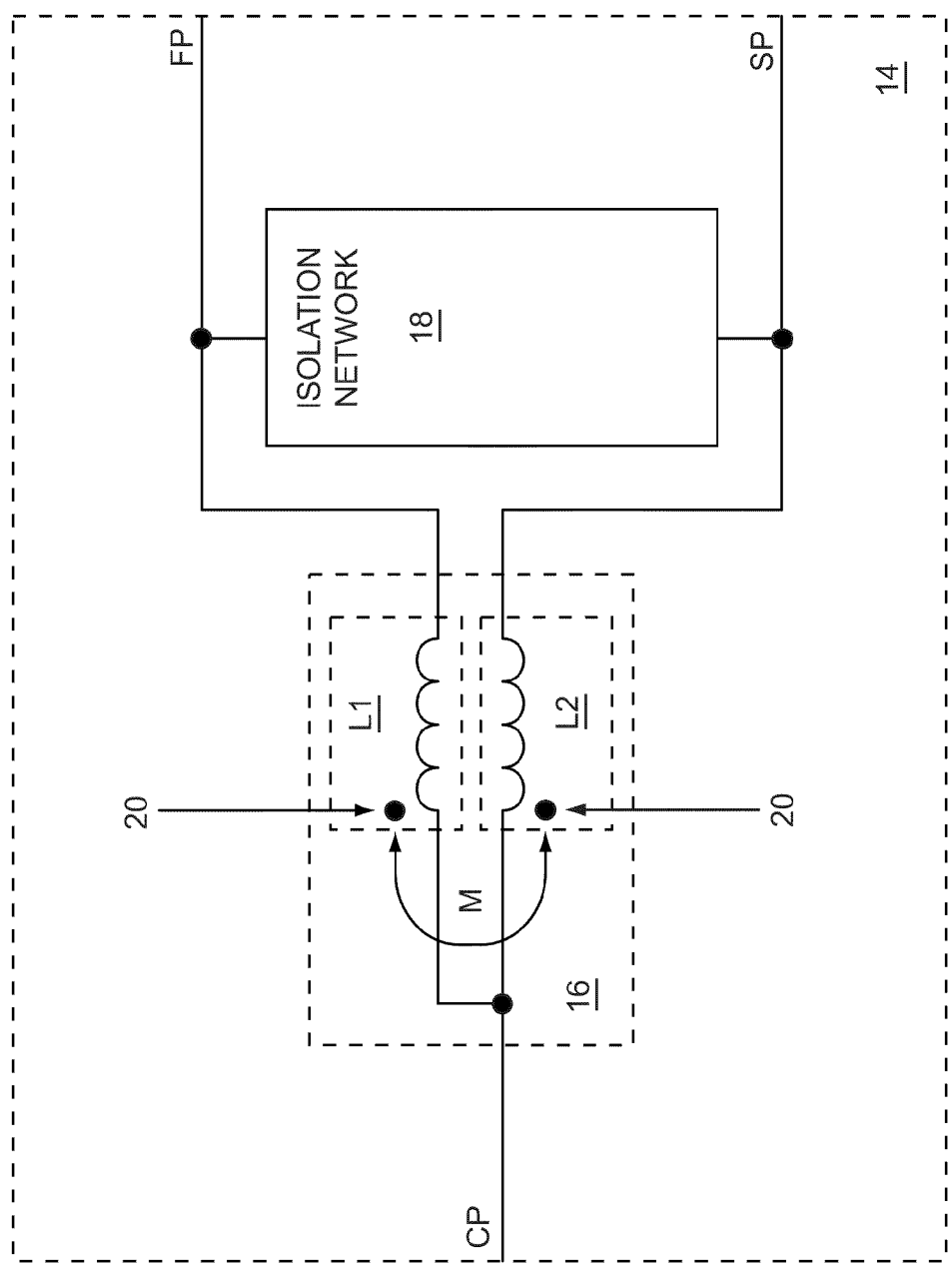
FIG. 3 shows a lumped cross-coupled Wilkinson circuit according to one embodiment of the lumped cross-coupled Wilkinson circuit.

FIG. 3 shows a lumped cross-coupled Wilkinson circuit 14 according to one embodiment of the lumped cross-coupled Wilkinson circuit 14. The lumped cross-coupled Wilkinson circuit 14 includes a pair of magnetically coupled inductive elements 16 and an isolation network 18. The pair of magnetically coupled inductive elements 16 has a mutual inductance M and includes a first inductive element L1 coupled between a first port FP and a common port CP, and a second inductive element L2 coupled between a second port SP and the common port CP. The second inductive element L2 is magnetically cross-coupled to the first inductive element L1, and the first inductive element L1 has a first inductance and the second inductive element L2 has a second inductance. The isolation network 18 is coupled between the first port FP and the second port SP. Since the second inductive element L2 is magnetically cross-coupled to the first inductive element L1, the first inductance and the second inductance may be less than comparable inductances in a lumped traditional Wilkinson combiner 10. Since the first and the second inductances may be less, the sizes and resistive losses of the first and the second inductive elements L1, L2 may be significantly smaller.

The magnetic alignment of the first inductive element L1 and the second inductive element L2 is illustrated with magnetic alignment dots 20. The magnetic alignment dot 20 for each of the first inductive element L1 and the second inductive element L2 is located at the ends of the first inductive element L1 and the second inductive element L2 that are coupled to the common port CP. Therefore, the first inductive element L1 and the second inductive element L2 are aligned to be magnetically reinforcing. Specifically, if the first port FP and the second port SP are shorted together and an AC signal is applied between the common port CP and the shorted first and second ports FC, SP, the resulting magnetic field produced in the first inductive element L1 would reinforce the resulting magnetic field produced in the second inductive element L2. In other words, the first and the second inductive elements L1, L2 have reinforcing mutually coupled magnetic flux. If one of the magnetic alignment dots 20 were located at an opposite end, then resulting magnetic fields produced in the first and the second inductive elements L1, L2 would tend to cancel one another. Such an alignment would be magnetically canceling instead of magnetically reinforcing. This intentional coupling polarity of an inductor pair creates magnetic reinforcement that allows values of individual inductors to be reduced.

In one embodiment of the pair of magnetically coupled inductive elements 16, a magnitude of the first inductance is about equal to a magnitude of the second inductance, and a coupling factor $K_X$ is associated with the first inductive element L1 and the second inductive element L2 and is about equal to a magnitude of the mutual inductance M divided by the magnitude of the first inductance. The lumped cross-coupled Wilkinson circuit 14 may be symmetrical and the first port FP and the second port SP may be interchangeable. In a first exemplary embodiment of the pair of magnetically coupled inductive elements 16, the coupling factor $K_X$ is greater than about 0.4. In a second exemplary embodiment of the pair of magnetically coupled inductive elements 16, the coupling factor $K_X$ is greater than about 0.5. In a third exemplary embodiment of the pair of magnetically coupled inductive elements 16, the coupling factor $K_X$ is greater than about 0.6. In a fourth exemplary embodiment of the pair of magnetically coupled inductive elements 16, the coupling factor $K_X$ is greater than about 0.7. In a fifth exemplary embodiment of the pair of magnetically coupled inductive elements 16, the coupling factor $K_X$ is greater than about 0.8. $K_X$ can be any value between 0 and 1. The value of $K_X$ depends upon how the inductors are implemented. As discussed later, strongly coupling the inductors by increasing $K_X$ results in a reduction of the inductance required to implement the combiner or splitter.

The lumped cross-coupled Wilkinson circuit 14 may present an impedance $Z_H$ to the common port CP and an impedance $Z_L$ to the first port FP and the second port SP. In other words, the lumped cross-coupled Wilkinson circuit 14 may provide an impedance transformation from $Z_H$ to $Z_L$ at the center frequency of operation $\omega_o$. The magnitude of the first and second inductances may be defined by EQ. 1:

$$L_S = \frac{1}{\omega_0(1+K_X)} Z_L \sqrt{\frac{2Z_H}{Z_L} - 1}, \quad \text{EQ. 1}$$

where $L_S$ is the magnitude of the first and the second inductances, $Z_H$ is the magnitude of the common impedance at the isolation frequency, $Z_L$ is the magnitude of the first and the second impedances at the isolation frequency, $K_X$ is the coupling factor, and $w_o$ is a magnitude of the center frequency of operation. This equation shows that increasing $K_X$ reduces the required value of $L_S$. If $K_X=1$, then $L_S$ is reduced by a factor of one half. If $K_X=0.5$, then $L_S$ is reduced by a factor of two thirds.

Figure 4:
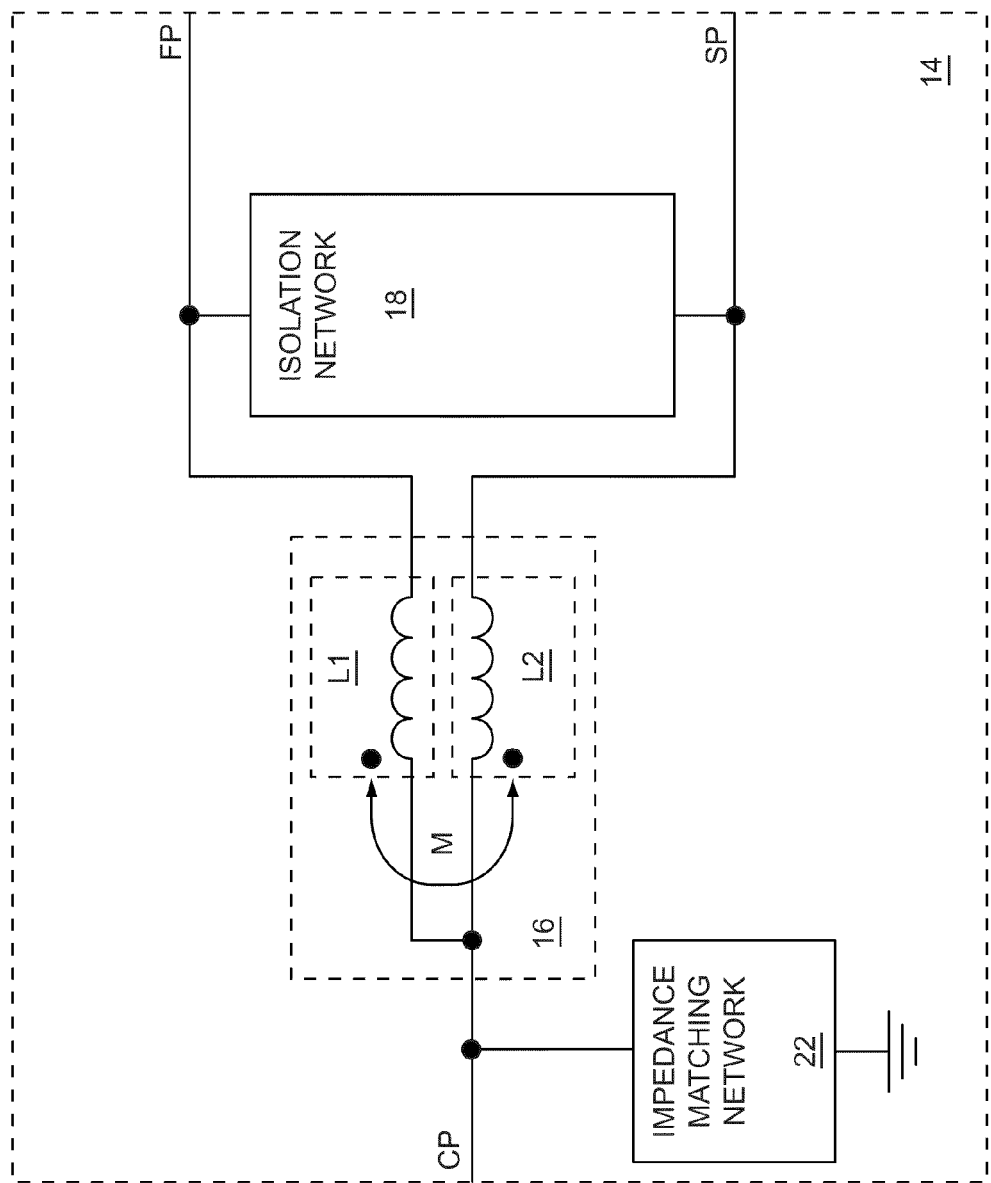
FIG. 4 shows the lumped cross-coupled Wilkinson circuit according to an alternate embodiment of the lumped cross-coupled Wilkinson circuit.
Figure 5:
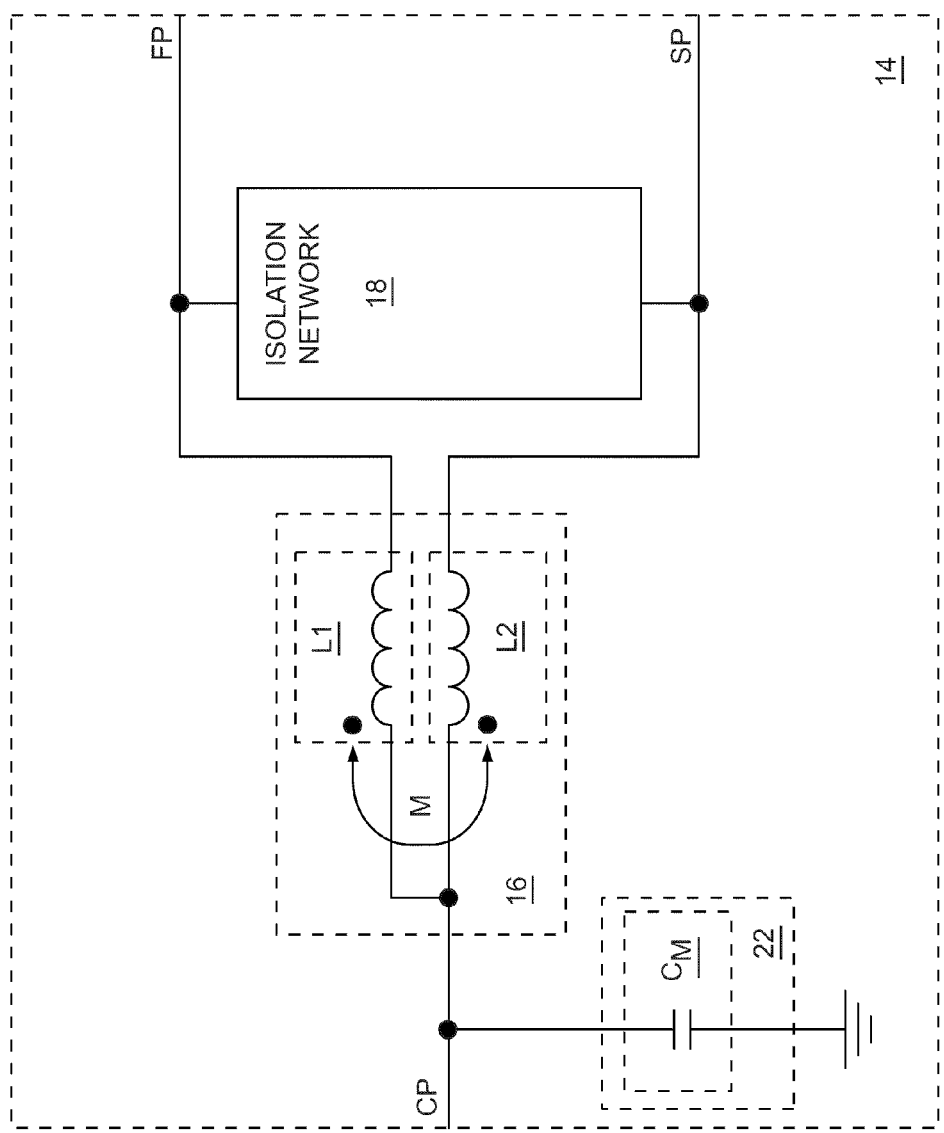
FIG. 5 shows details of an impedance matching network illustrated in FIG. 4.

FIG. 4 shows the lumped cross-coupled Wilkinson circuit 14 according to an alternate embodiment of the lumped cross-coupled Wilkinson circuit 14. The lumped cross-coupled Wilkinson circuit 14 illustrated in FIG. 4 is similar to the lumped cross-coupled Wilkinson circuit 14 illustrated in FIG. 3, except the lumped cross-coupled Wilkinson circuit 14 illustrated in FIG. 4 includes an impedance matching network 22 coupled between the common port CP and ground. The impedance matching network 22 may enhance impedance matching of the lumped cross-coupled Wilkinson circuit 14, may enhance isolation between the first port FP and the second port SP, or both. In general, the impedance matching network 22 is required for normal behavior, except under some very specific exceptions. In another embodiment of the lumped cross-coupled Wilkinson circuit 14, the impedance matching network 22 may be coupled between the common port CP and a reference (not shown), such as an AC reference or a direct current (DC) reference FIG. 5 shows details of the impedance matching network 22 illustrated in FIG. 4. The impedance matching network 22 includes an impedance matching capacitive element $C_M$ coupled between the common port CP and ground. The impedance matching network 22 illustrated in FIG. 5 is exemplary. Therefore, other embodiments of the impedance matching network 22 are not limited to the embodiment illustrated in FIG. 5, and may include any number of capacitive elements, any number of resistive elements, any number of inductive elements, and any number of other components having any arrangement.

Figure 6:
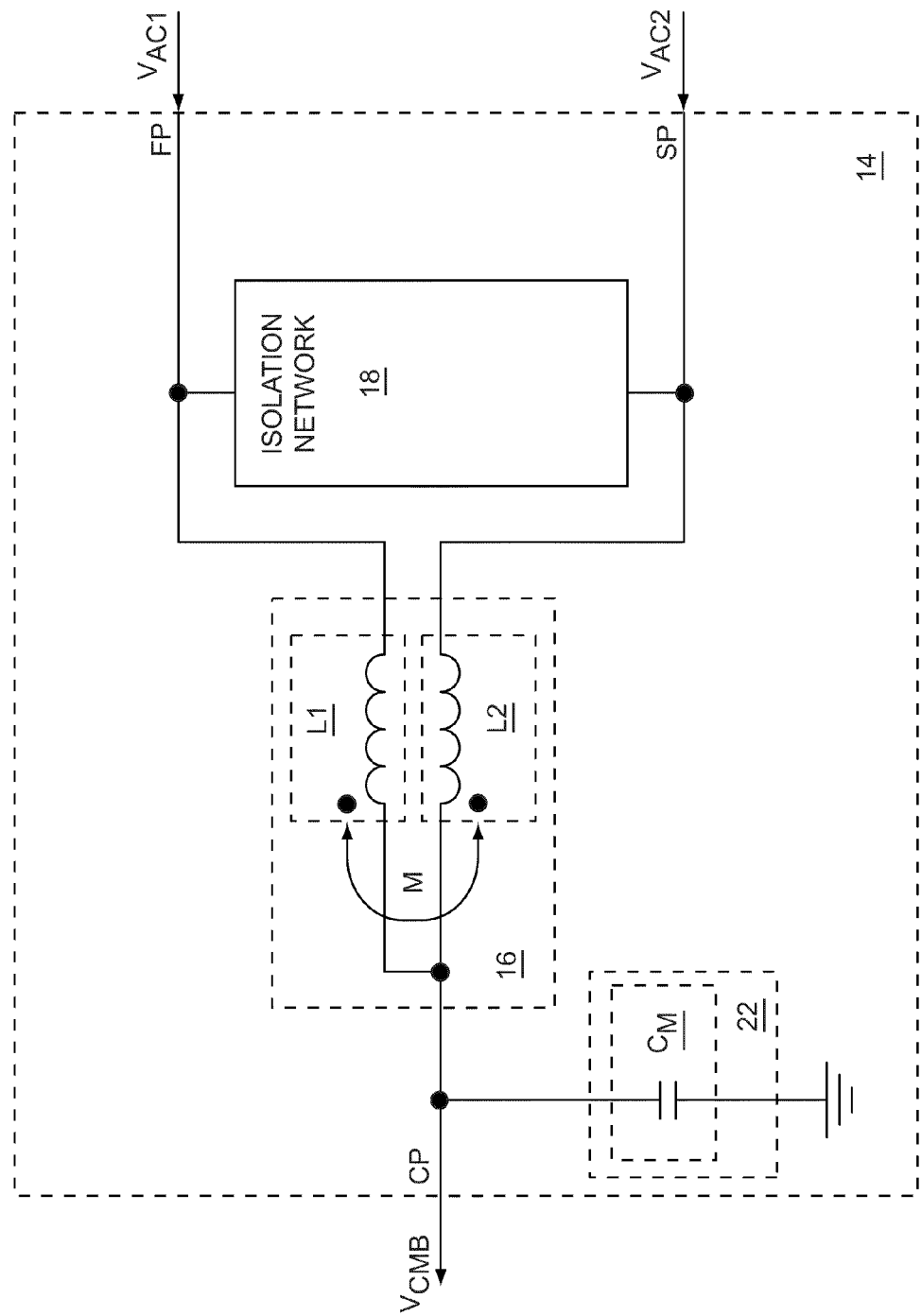
FIG. 6 shows the lumped cross-coupled Wilkinson circuit illustrated in FIG. 3 operating as a lumped cross-coupled Wilkinson combiner.
Figure 7:
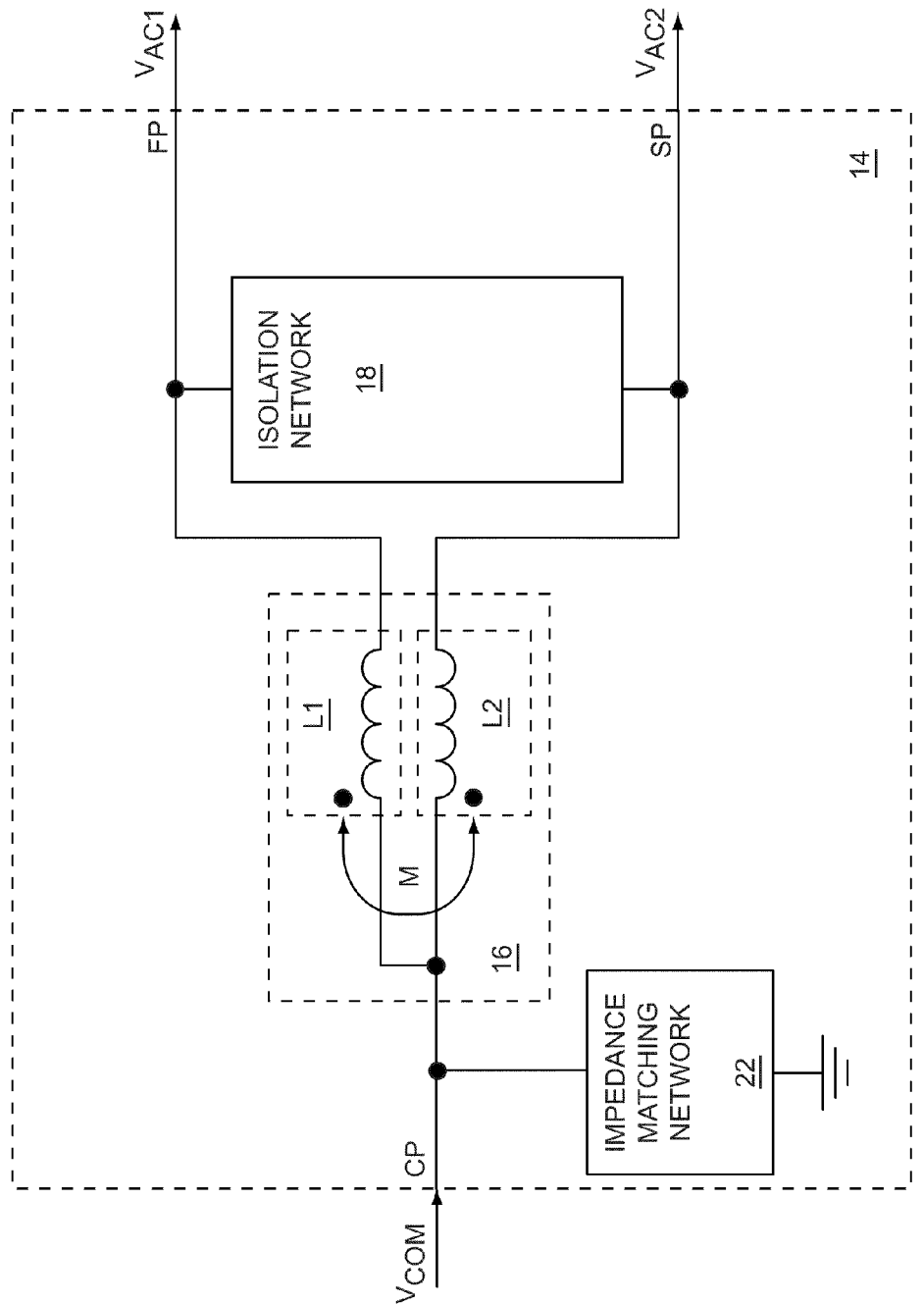
FIG. 7 shows the lumped cross-coupled Wilkinson circuit illustrated in FIG. 3 operating as a lumped cross-coupled Wilkinson splitter.

FIG. 6 shows the lumped cross-coupled Wilkinson circuit 14 illustrated in FIG. 3 operating as a lumped cross-coupled Wilkinson combiner. The first port FP and the second port SP receive a first AC signal $V_{AC1}$ and a second AC signal $V_{AC2}$, respectively, and a common port CP provides a combined AC signal $V_{CMB}$, which is based on combining the first AC signal $V_{AC1}$ and the second AC signal $V_{AC2}$. FIG. 7 shows the lumped cross-coupled Wilkinson circuit 14 illustrated in FIG. 3 operating as a lumped cross-coupled Wilkinson splitter. The common port CP receives a common AC signal $V_{COM}$, and the first port FP and the second port SP provide a first AC signal $V_{AC1}$ and a second AC signal $V_{AC2}$, respectively, based on splitting the common AC signal $V_{COM}$.

Figure 8:
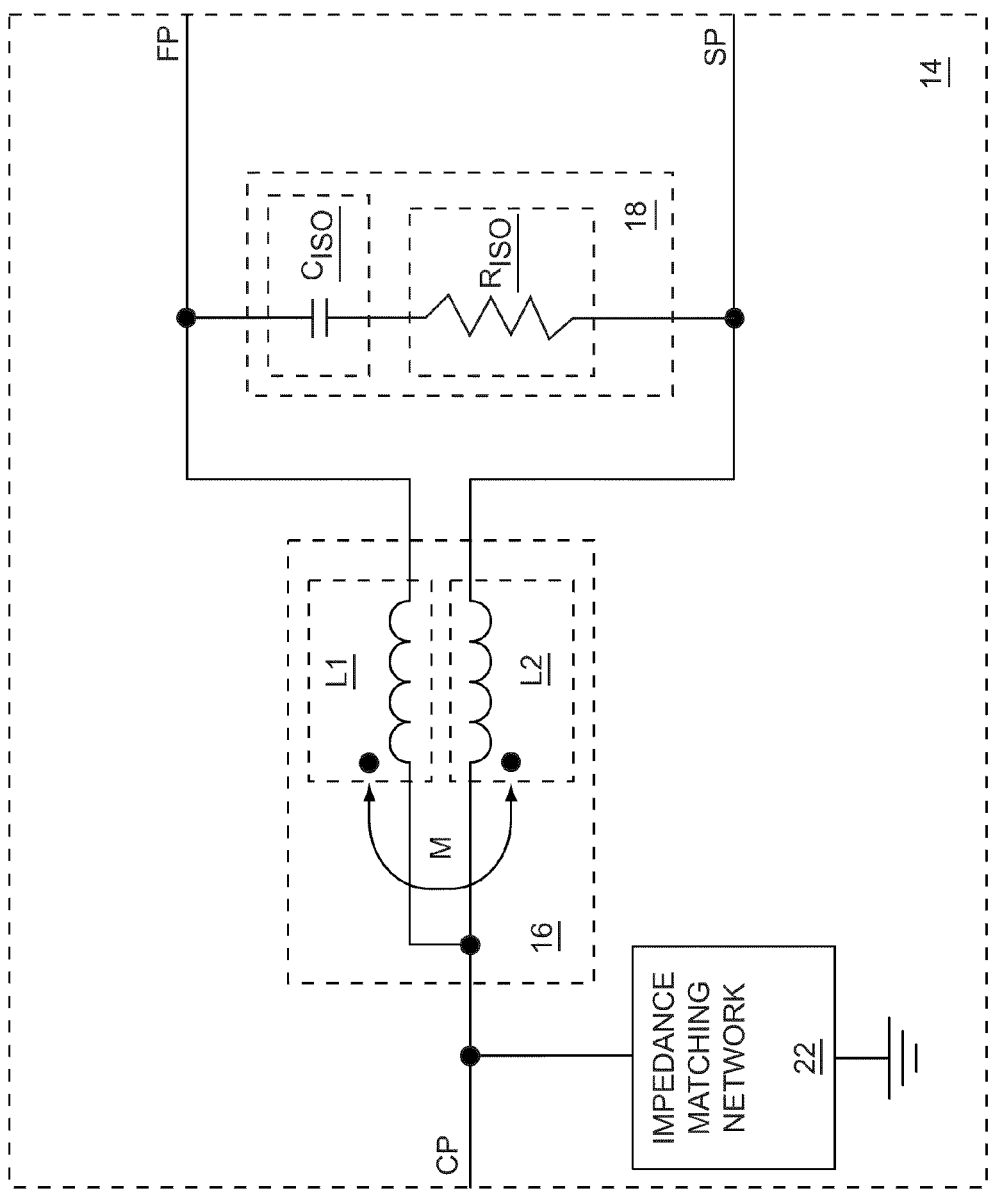
FIG. 8 shows details of an isolation network illustrated in FIG. 3.

FIG. 8 shows details of the isolation network 18 illustrated in FIG. 3. The isolation network 18 includes an isolation capacitive element $C_{ISO}$ and an isolation resistive element $R_{ISO}$ coupled in series between the first port FP and the second port SP. The isolation network 18 illustrated in FIG. 8 is exemplary. Therefore, other embodiments of the isolation network 18 illustrated in FIG. 8 are not limited to the embodiment illustrated in FIG. 8, and may include any number of capacitive elements, any number of resistive elements, any number of inductive elements, and any number of other components having any arrangement.

Figure 9:
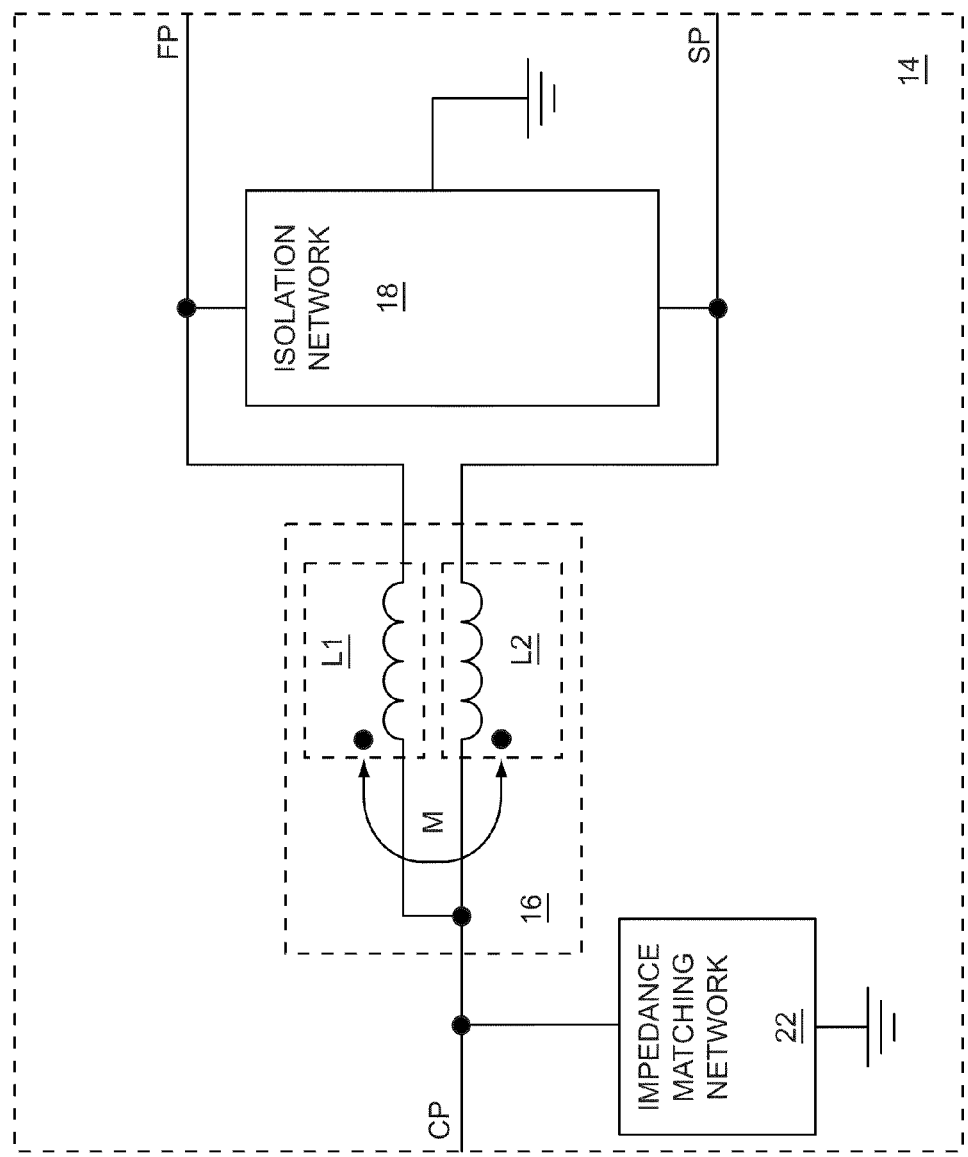
FIG. 9 shows the lumped cross-coupled Wilkinson circuit according to an additional embodiment of the lumped cross-coupled Wilkinson circuit.

FIG. 9 shows the lumped cross-coupled Wilkinson circuit 14 according to an additional embodiment of the lumped cross-coupled Wilkinson circuit 14. The isolation network 18 is coupled to ground in addition to being coupled between the first port FP and the second port SP. In another embodiment of the lumped cross-coupled Wilkinson circuit 14, the isolation network 18 may be coupled to a reference (not shown), such as an AC reference or a direct current (DC) reference, instead of to being coupled to ground.

Figure 10:
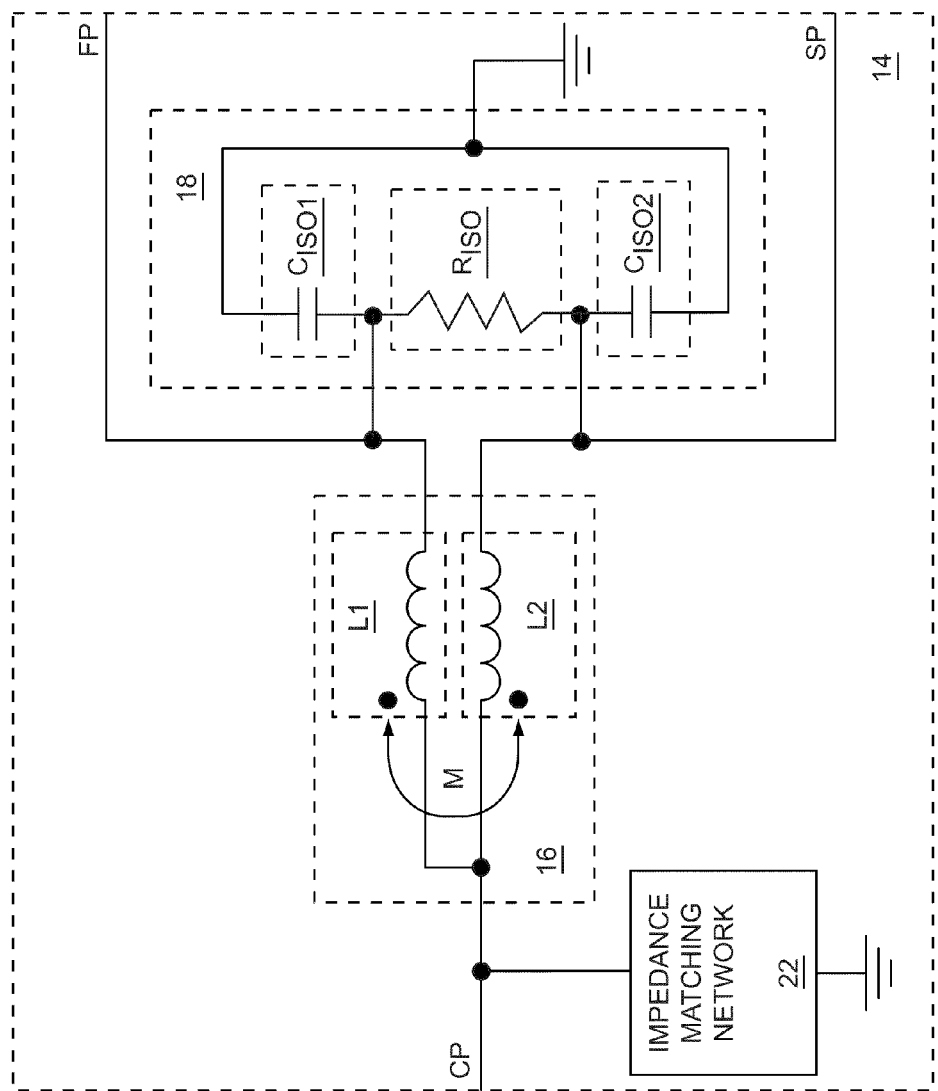
FIG. 10 shows details of the isolation network illustrated in FIG. 9.

FIG. 10 shows details of the isolation network 18 illustrated in FIG. 9. The isolation network 18 includes the isolation resistive element $R_{ISO}$ coupled between the first port FP and the second port SP, a first isolation capacitive element $C_{ISO1}$ coupled between the first port FP and ground, and a second isolation capacitive element $C_{ISO2}$ coupled between the second port SP and ground. The isolation network 18 illustrated in FIG. 10 is exemplary. Therefore, other embodiments of the isolation network 18 illustrated in FIG. 10 are not limited to the embodiment illustrated in FIG. 10, and may include any number of capacitive elements, any number of resistive elements, any number of inductive elements, and any number of other components having any arrangement.

Figure 11:
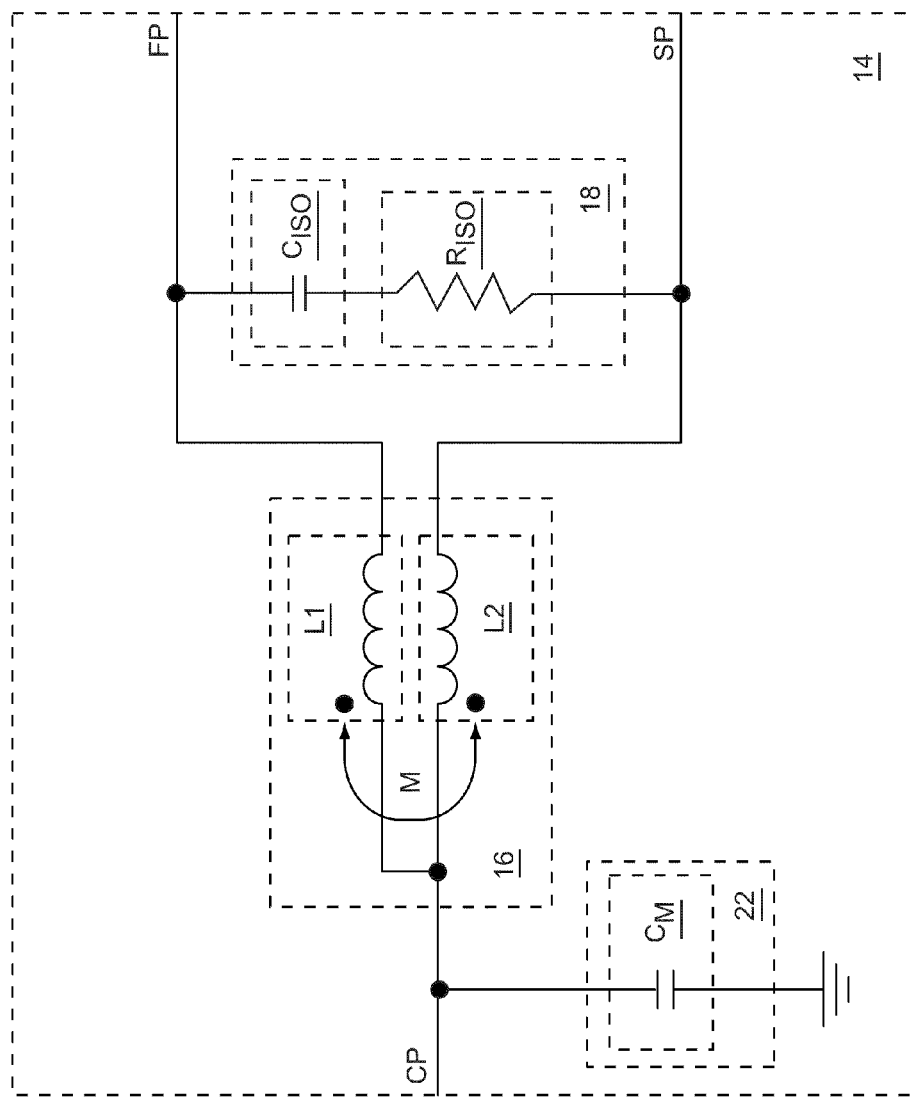
FIG. 11 shows the lumped cross-coupled Wilkinson circuit according to another embodiment of the lumped cross-coupled Wilkinson circuit.

FIG. 11 shows the lumped cross-coupled Wilkinson circuit 14 according to another embodiment of the lumped cross-coupled Wilkinson circuit 14. The lumped cross-coupled Wilkinson circuit 14 illustrated in FIG. 11 includes the isolation network 18 illustrated in FIG. 8 and the impedance matching network 22 illustrated in FIG. 5.

The lumped cross-coupled Wilkinson circuit 14 may present the common impedance to the common port CP, the first impedance to the first port FP, and the second impedance to the second port SP. The first impedance may be equal to the second impedance at the isolation frequency. When a common external impedance having a magnitude about equal to the magnitude of the common impedance is presented to the common port CP, a first external impedance having a magnitude about equal to the magnitude of the first impedance is presented to the first port FP, and a second external impedance having the magnitude about equal to a magnitude of the second impedance is presented to the second port SP, then the first port FP may be about isolated from the second port SP.

When the magnitude of the first inductance is about equal to the magnitude of the second inductance and the magnitude of the first impedance is about equal to the magnitude of the second impedance, a magnitude of a capacitance of the impedance matching capacitive element $C_M$ may be defined by EQ. 2, a magnitude of a capacitance of the isolation capacitive element $C_{ISO}$ may be defined by EQ. 3, and a magnitude of a resistance of the isolation resistive element $R_{ISO}$ may be defined by EQ. 4. EQ. 1 is repeated for clarity.

$$L_S = \frac{1}{\omega_0(1+K_X)} Z_L \sqrt{\frac{2Z_H}{Z_L} - 1} \qquad \text{EQ. 1}$$

$$C_M = \frac{1}{\omega_0 Z_H} \sqrt{\frac{2Z_H}{Z_L} - 1} \qquad \text{EQ. 2}$$

$$C_{iso} = \frac{1}{2(1-K_X)L_S} \left[ \frac{1}{\omega_0^2} + \frac{(1-K_X)^2 L_S^2}{Z_L^2} \right] \qquad \text{EQ. 3}$$

$$R_{iso} = \frac{(1+K_X)L_S}{Z_L C_{iso}}, \qquad \text{EQ. 4}$$

where $L_S$ is the magnitude of the first and second inductances, $Z_H$ is the magnitude of the common impedance at the isolation frequency, $Z_L$ is the magnitude of the first and second impedances at the isolation frequency, $K_X$ is the coupling factor, $\omega_o$ is a magnitude of the isolation frequency, $C_M$ is the magnitude of the capacitance of the impedance matching capacitive element $C_M$, $C_{iso}$ is the magnitude of the capacitance of the isolation capacitive element $C_{ISO}$, and $R_{iso}$ is the magnitude of the resistance of the isolation resistive element $R_{ISO}$. EQ. 2 demonstrates that the impedance matching capacitive element $C_M$ is needed for proper operation under all conditions, except for when $Z_L=2Z_H$, wherein $C_M=0$. In general, the impedance matching network 22 is required for normal behavior, except under some very specific exceptions. Equations 1, 2, 3, and 4 may mathematically describe parametric relationships under the aforementioned conditions. The mathematic relationships presented are exemplary. Therefore, other embodiments of the present invention may have other mathematical relationships.

Figure 12:
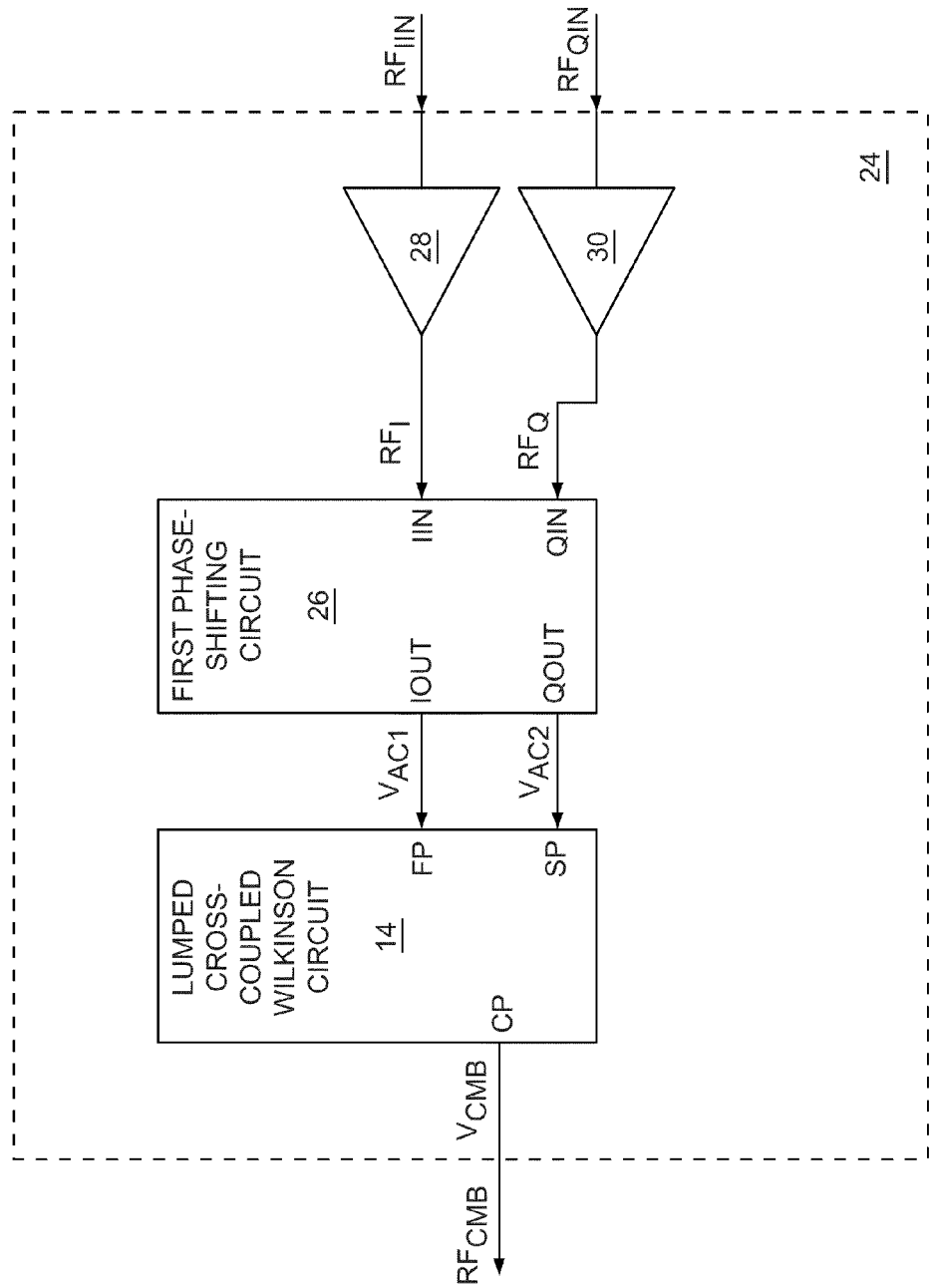
FIG. 12 shows the lumped cross-coupled Wilkinson circuit operating as a combiner in power amplifier circuitry according to one embodiment of the present invention.

FIG. 12 shows the lumped cross-coupled Wilkinson circuit 14 operating as a combiner in power amplifier circuitry 24 according to one embodiment of the present invention. The power amplifier circuitry 24 may function as quadrature power amplifier circuitry, which may include a first phase-shifting circuit 26, an in-phase power amplifier 28, and a quadrature-phase power amplifier 30. The in-phase power amplifier 28 receives and amplifies an in-phase RF input signal $RF_{IIN}$ to provide an in-phase RF signal $RF_I$ to an in-phase input IIN of the first phase-shifting circuit 26. The quadrature-phase power amplifier 30 receives and amplifies a quadrature-phase RF input signal $RF_{QIN}$ to provide a quadrature-phase RF signal $RF_Q$ to a quadrature-phase input QIN of the first phase-shifting circuit 26. The quadrature-phase RF signal $RF_Q$ is nominally phase-shifted from the in-phase RF signal $RF_I$ by about 90 degrees. The first phase-shifting circuit 26 phase-shifts the in-phase RF signal $RF_I$, the quadrature-phase RF signal $RF_Q$, or both, to provide approximately phase-aligned in-phase and quadrature-phase RF signals $RF_I$, $RF_Q$, respectively, from an in-phase output port IOUT and a quadrature-phase output port QOUT, respectively, of the first phase-shifting circuit 26.

The approximately phase-aligned in-phase and quadrature-phase RF signals $RF_I$, $RF_Q$ provide the first and the second AC signals $V_{AC1}$, $V_{AC2}$, respectively. The first port FP and the second port SP of the lumped cross-coupled Wilkinson circuit 14 receive the first AC signal $V_{AC1}$ and the second AC signal $V_{AC2}$, respectively, and the common port CP of the lumped cross-coupled Wilkinson circuit 14 provides the combined AC signal $V_{CMB}$, which is based on combining the first AC signal $V_{AC1}$ and the second AC signal $V_{AC2}$. The combined AC signal $V_{CMB}$ provides a combined RF signal $RF_{CMB}$, which is based on combining the approximately phase-aligned in-phase and quadrature-phase RF signals $RF_I$, $RF_Q$. In one embodiment of the present invention, the combined RF signal $RF_{CMB}$ is an RF transmit signal.

Figure 13:
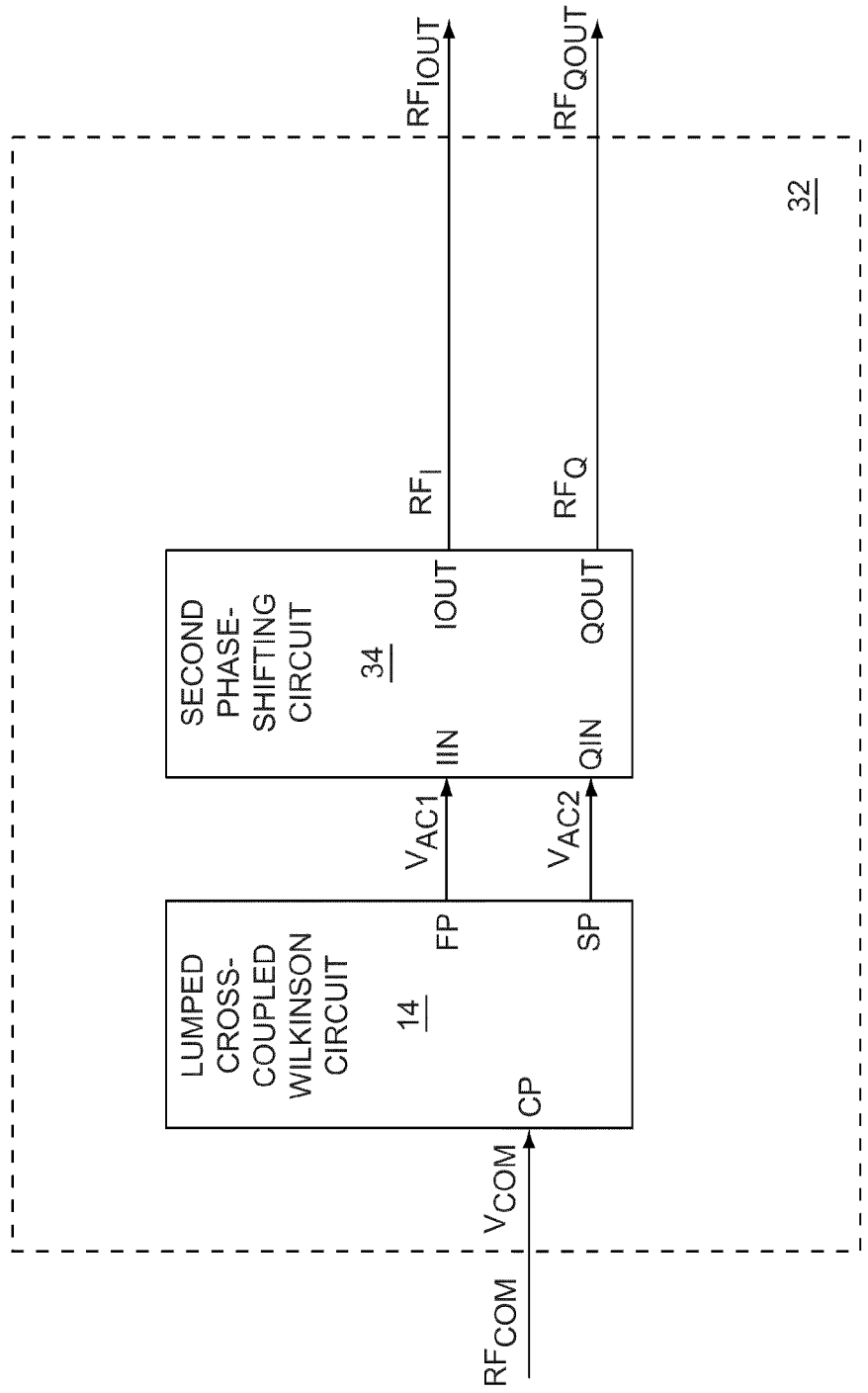
FIG. 13 shows the lumped cross-coupled Wilkinson circuit operating as a splitter in a quadrature RF splitter circuit according to an alternate embodiment of the present invention.

FIG. 13 shows the lumped cross-coupled Wilkinson circuit 14 operating as a splitter in a quadrature RF splitter circuit 32 according to an alternate embodiment of the present invention. The quadrature RF splitter circuit 32 includes the lumped cross-coupled Wilkinson circuit 14 and a second phase-shifting circuit 34. A common RF signal $RF_{COM}$ provides the common AC signal $V_{COM}$ to the common port CP of the lumped cross-coupled Wilkinson circuit 14. The first port FP and the second port SP of the lumped cross-coupled Wilkinson circuit 14 provide the first AC signal $V_{AC1}$ and the second AC signal $V_{AC2}$, respectively, based on splitting the common AC signal $V_{COM}$. The first AC signal $V_{AC1}$ and the second AC signal $V_{AC2}$ feed an in-phase input IIN and a quadrature-phase input QIN, respectively, of the second phase-shifting circuit 34, which phase-shifts the first AC signal $V_{AC1}$, the second AC signal $V_{AC2}$, or both, to provide an in-phase RF signal $RF_I$ and a quadrature-phase RF signal $RF_Q$, respectively, from an in-phase output IOUT and a quadrature-phase output QOUT, respectively, of the second phase-shifting circuit 34. The in-phase RF signal $RF_I$ and the quadrature-phase RF signal $RF_Q$ provide an in-phase RF output signal $RF_{IOUT}$ and a quadrature-phase RF output signal $RF_{QOUT}$, respectively. The quadrature-phase RF signal $RF_Q$ is phase-shifted from the in-phase RF signal $RF_I$ by about 90 degrees.

Figure 14:
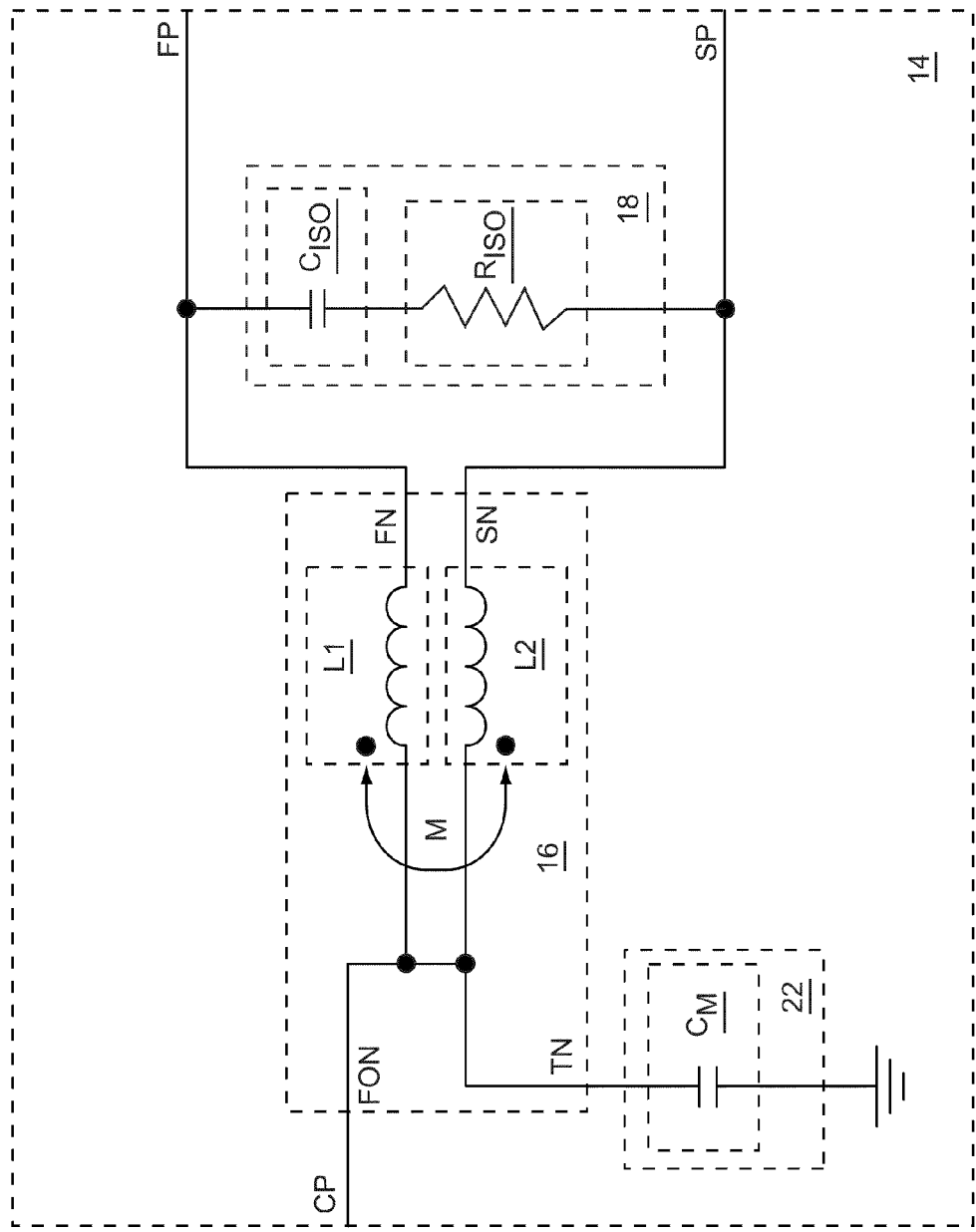
FIG. 14 shows the lumped cross-coupled Wilkinson circuit according to a supplemental embodiment of the lumped cross-coupled Wilkinson circuit.

FIG. 14 shows the lumped cross-coupled Wilkinson circuit 14 according to a supplemental embodiment of the lumped cross-coupled Wilkinson circuit 14. The lumped cross-coupled Wilkinson circuit 14 illustrated in FIG. 14 is similar to the lumped cross-coupled Wilkinson circuit 14 illustrated in FIG. 11, except the pair of magnetically coupled inductive elements 16 illustrated in FIG. 14 includes a first connection node FN, a second connection node SN, a third connection node TN, and a fourth connection node FON. The third connection node TN is coupled to the fourth connection node FON, the first inductive element L1 is coupled between the first connection node FN and the third and the fourth connection nodes TN, FON, and the second inductive element L2 is coupled between the second connection node SN and the third and the fourth connection nodes TN, FON. The first connection node FN is coupled to the first port FP, the second connection node SN is coupled to the second port SP, the third connection node TN is coupled to the impedance matching network 22, and the fourth connection node FON is coupled to the common port CP.

Figure 15:
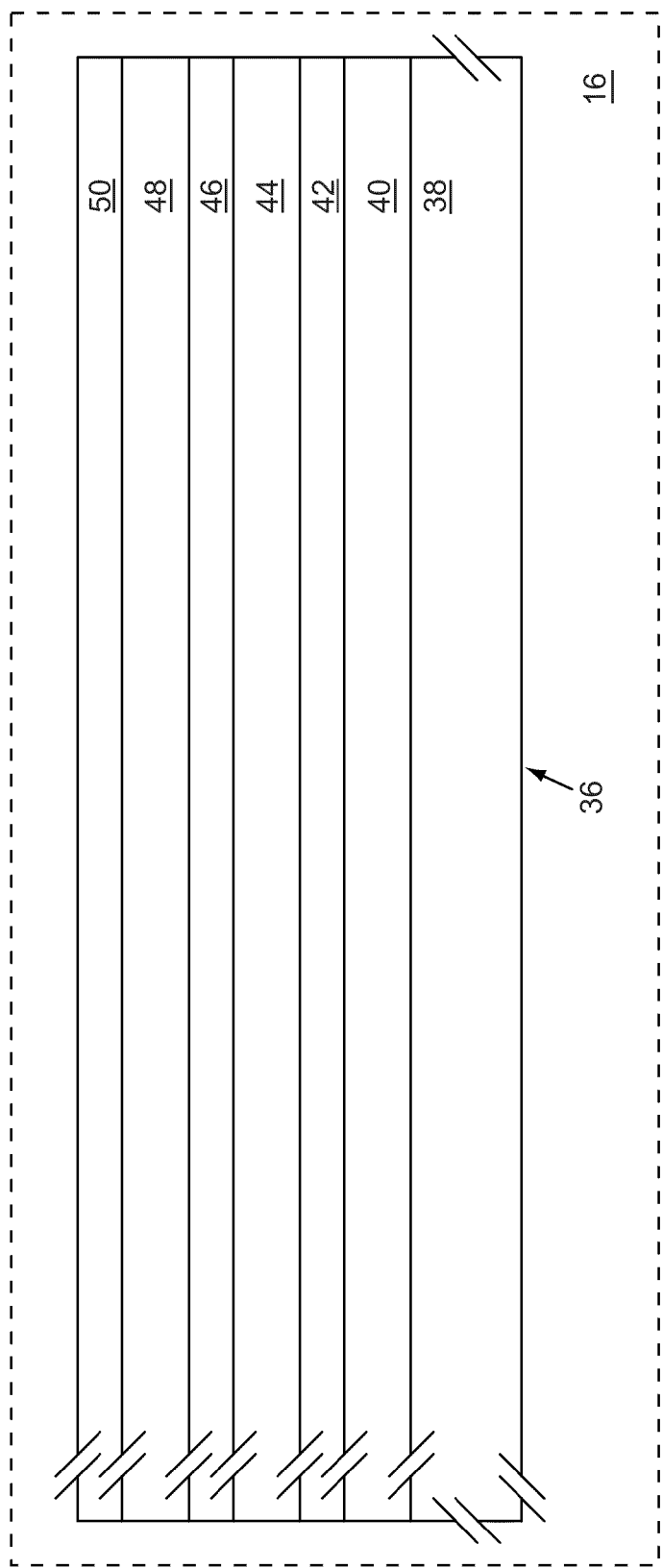
FIG. 15 shows a layer stack-up of a pair of magnetically coupled inductive elements according to one embodiment of the pair of magnetically coupled inductive elements.

FIG. 15 shows a layer stack-up of the pair of magnetically coupled inductive elements 16 according to one embodiment of the pair of magnetically coupled inductive elements 16. The pair of magnetically coupled inductive elements 16 include a laminated structure 36, which has a substrate 38, a first insulating layer 40 over the substrate 38, a first metallization layer 42 over the first insulating layer 40, a second insulating layer 44 over the first metallization layer 42, a second metallization layer 46 over the second insulating layer 44, a third insulating layer 48 over the second metallization layer 46, and a third metallization layer 50 over the third insulating layer 48. The laminated structure 36 may or may not be a semiconductor die. The substrate 38 may or may not include semiconductor material. The pair of magnetically coupled inductive elements 16 illustrated in FIG. 15 is exemplary. Therefore, other embodiments of the pair of magnetically coupled inductive elements 16 are not limited to the embodiment illustrated in FIG. 15, and may include a laminated structure 36 having any number of layers in any arrangement, or may not include a laminated structure 36.

Figure 16:
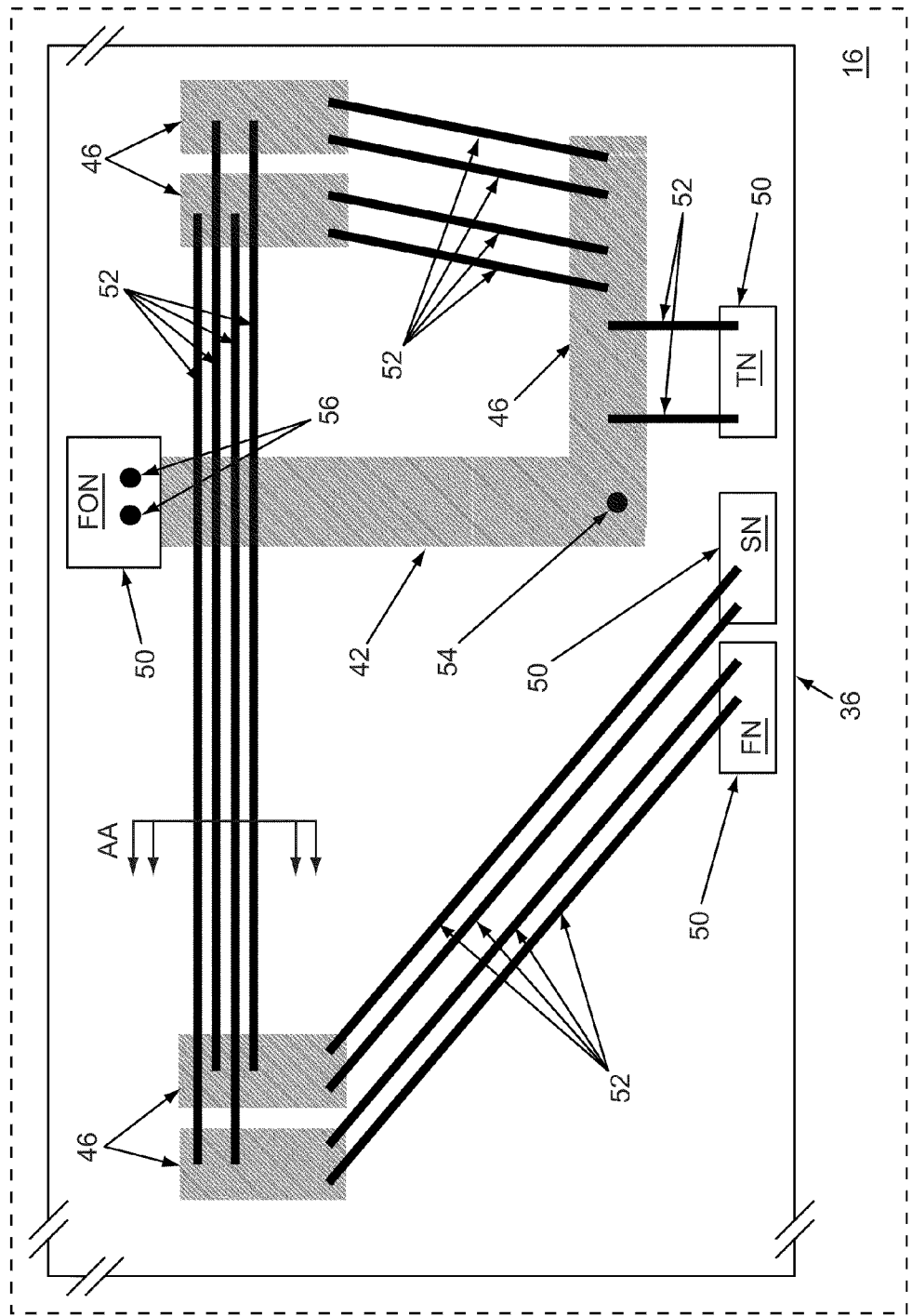
FIG. 16 shows a top view of construction details of the pair of magnetically coupled inductive elements illustrated in FIG. 15.

FIG. 16 shows a top view of the construction details of the pair of magnetically coupled inductive elements 16 illustrated in FIG. 15. FIG. 16 includes a cross-section AA of the pair of magnetically coupled inductive elements 16. The third metallization layer 50 provides the first connection node FN, the second connection node SN, the third connection node TN, and the fourth connection node FON. Sections of the second metallization layer 46, the first connection node FN, the second connection node SN, and the third connection node TN provide attachment points for bonding wires 52. The sections of the second metallization layer 46 and the bonding wires 52 are arranged to form the first inductive element L1 and the second inductive element L2. Magnetic cross-coupling between the first inductive element L1 and the second inductive element L2 is provided by the proximity of the bonding wires 52 to one another and the proximity of the sections of the second metallization layer 46 to one another. The sections of the second metallization layer 46 and the bonding wires 52 may be arranged to balance losses between the first inductive element L1 and the second inductive element L2, arranged to balance parasitic capacitances between the first inductive element L1 and the second inductive element L2, or both. The first metallization layer 42 provides an interconnection to the fourth connection node FON. A first via hole 54 provides an interconnection between the first metallization layer 42 and the second metallization layer 46. Second via holes 56 provide interconnections between the first metallization layer 42 and the third metallization layer 50.

Figure 17:
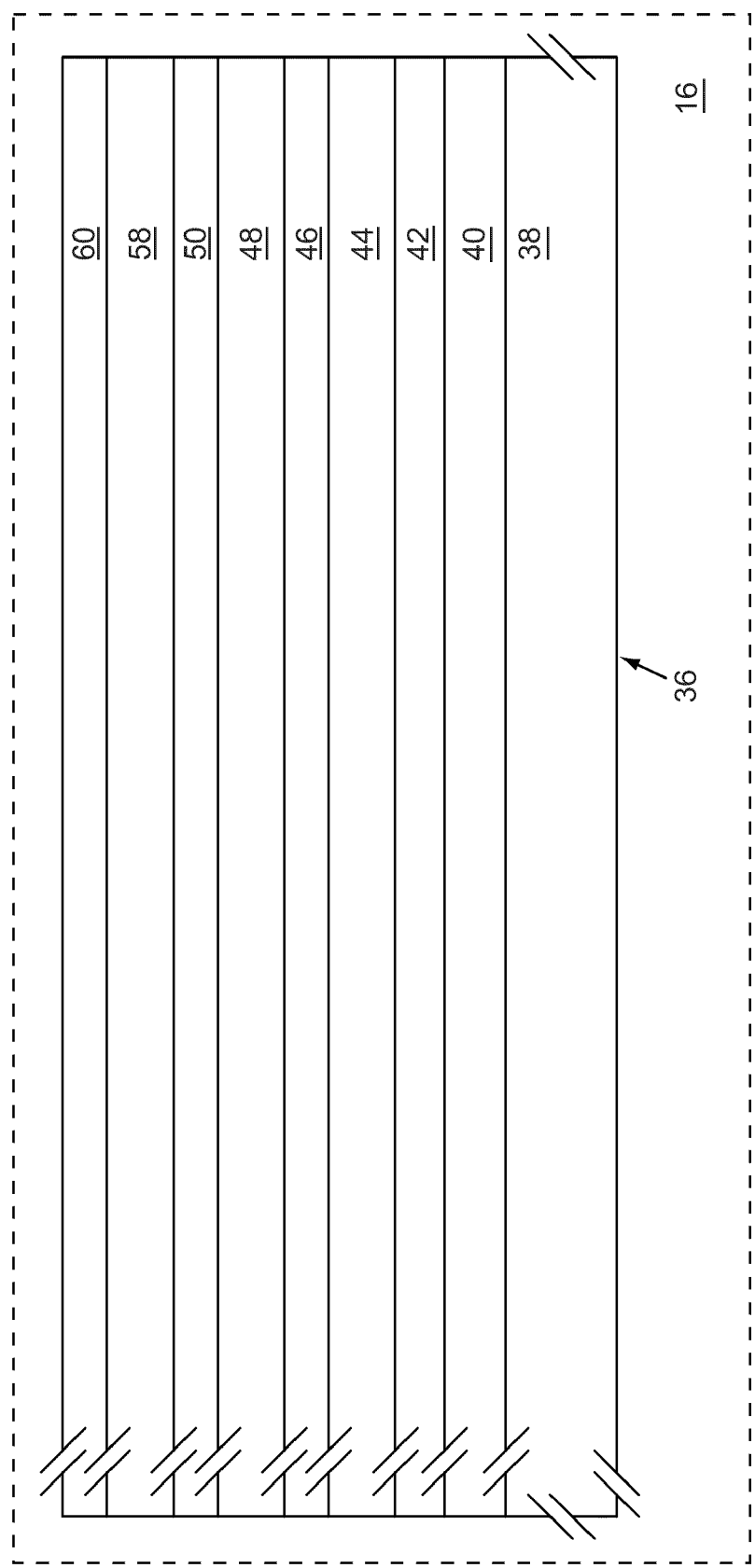
FIG. 17 shows the layer stack-up of the pair of magnetically coupled inductive elements according to an alternate embodiment of the pair of magnetically coupled inductive elements.

FIG. 17 shows the layer stack-up of the pair of magnetically coupled inductive elements 16 according to an alternate embodiment of the pair of magnetically coupled inductive elements 16. The pair of magnetically coupled inductive elements 16 include a laminated structure 36, which has a substrate 38, a first insulating layer 40 over the substrate 38, a first metallization layer 42 over the first insulating layer 40, a second insulating layer 44 over the first metallization layer 42, a second metallization layer 46 over the second insulating layer 44, a third insulating layer 48 over the second metallization layer 46, a third metallization layer 50 over the third insulating layer 48. A fourth insulating layer 58 over the third metallization layer 50, and a fourth metallization layer 60 over the fourth insulating layer 58. The laminated structure 36 may or may not be a semiconductor die. The substrate 38 may or may not include semiconductor material. The pair of magnetically coupled inductive elements 16 illustrated in FIG. 17 is exemplary. Therefore, other embodiments of the pair of magnetically coupled inductive elements 16 are not limited to the embodiment illustrated in FIG. 17, and may include a laminated structure 36 having any number of layers in any arrangement, or may not include a laminated structure 36.

Figure 18:
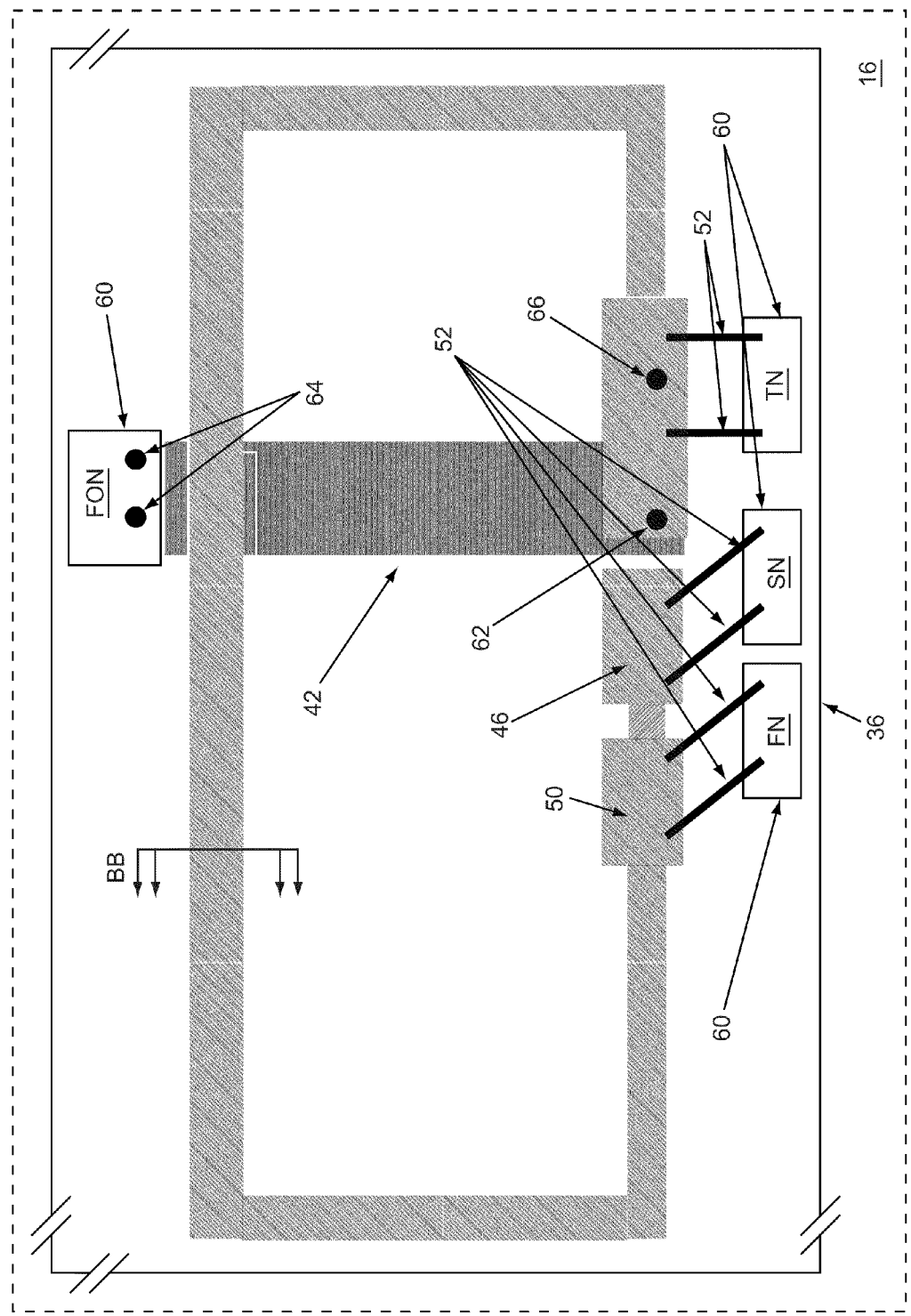
FIG. 18 shows a top view of construction details of the pair of magnetically coupled inductive elements illustrated in FIG. 17 according to an additional embodiment of the pair of magnetically coupled inductive elements.

FIG. 18 shows a top view of the construction details of the pair of magnetically coupled inductive elements 16 illustrated in FIG. 17 according to an additional embodiment of the pair of magnetically coupled inductive elements 16. FIG. 18 includes a cross-section BB of the pair of magnetically couple inductive elements 16. The fourth metallization layer 60 provides the first connection node FN, the second connection node SN, the third connection node TN, and the fourth connection node FON. The third metallization layer 50 is used to form the first inductive element L1 and to provide attachment points for bonding wires 52 that interconnect the first inductive element L1 to the first connection node FN and to the third connection node TN. The third metallization layer 50 provides a relatively narrow conductive trace routed in a rough loop to form the first inductive element L1. The second metallization layer 46 is used to form the second inductive element L2 and to provide attachment points for bonding wires 52 that interconnect the second inductive element L2 to the second connection node SN. The second metallization layer 46 provides a relatively narrow conductive trace routed in a rough loop to form the second inductive element L2. Magnetic cross-coupling between the first inductive element L1 and the second inductive element L2 is provided by placing the conductive trace provided by the third metallization layer 50 directly over the conductive trace provided by the second metallization layer 46.

The conductive trace provided by the third metallization layer 50 and the conductive trace provided by the second metallization layer 46 may be arranged to balance losses between the first inductive element L1 and the second inductive element L2, arranged to balance parasitic capacitances between the first inductive element L1 and the second inductive element L2, or both. The first metallization layer 42 provides an interconnection to the fourth connection node FON. A third via hole 62 provides an interconnection between the first metallization layer 42 and the third metallization layer 50. Fourth via holes 64 provide interconnections between the first metallization layer 42 and the fourth metallization layer 60. A fifth via hole 66 provides an interconnection between the second metallization layer 46 and the third metallization layer 50.

Figure 19:
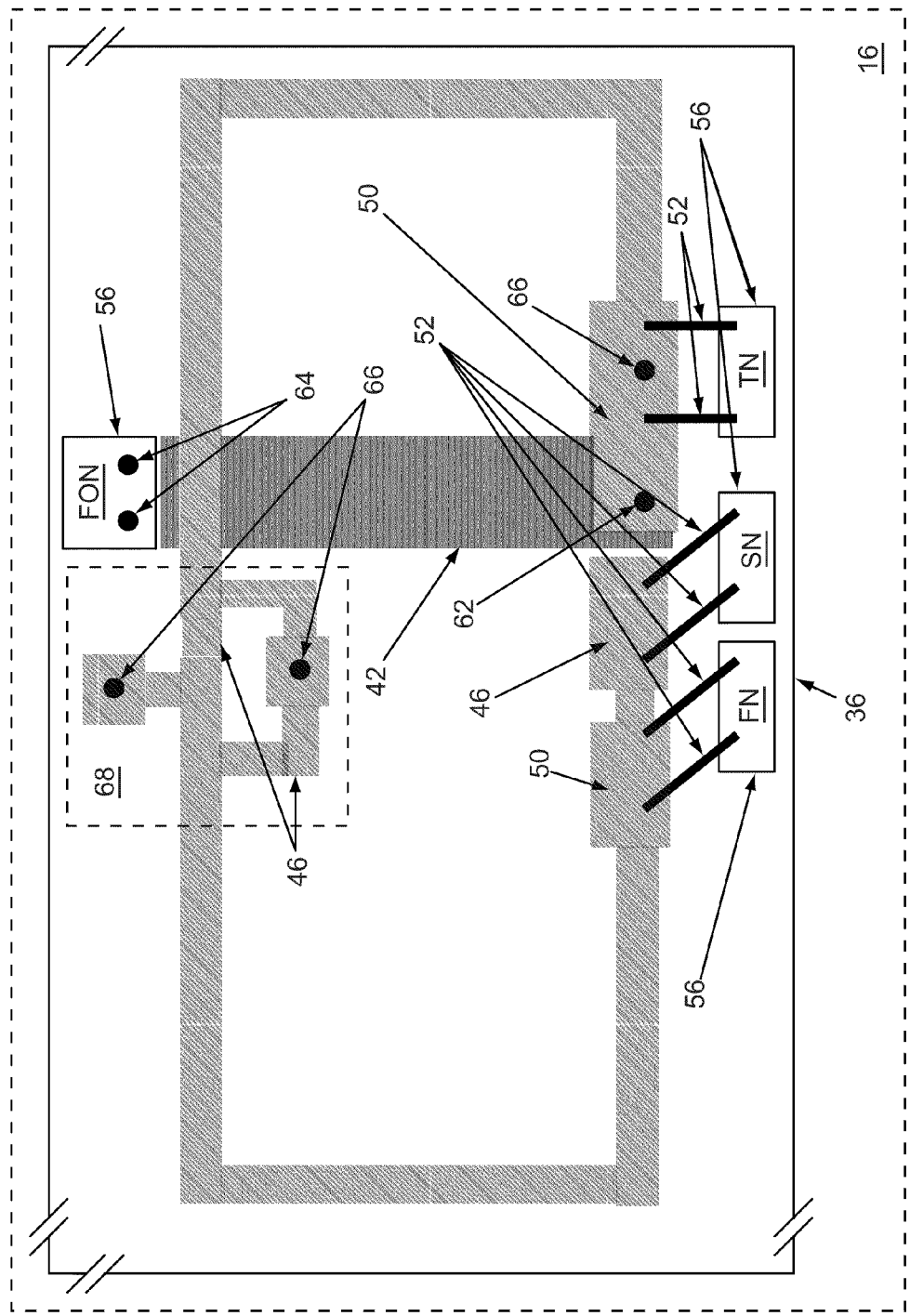
FIG. 19 shows a top view of construction details of the pair of magnetically coupled inductive elements illustrated in FIG. 17 according to another embodiment of the pair of magnetically coupled inductive elements.

FIG. 19 shows a top view of construction details of the pair of magnetically coupled inductive elements 16 illustrated in FIG. 17 according to an additional embodiment of the pair of magnetically coupled inductive elements 16. The pair of magnetically coupled inductive elements 16 illustrated in FIG. 19 is similar to the pair of magnetically coupled inductive elements 16 illustrated in FIG. 18, except the pair of magnetically coupled inductive elements 16 illustrated in FIG. 19 incorporates a layer swap arrangement 68 that swaps the second metallization layer 46 and the third metallization layer 50 in about the middle of conductive traces used to form the first inductive element L1 and the second inductive element L2. Therefore, instead of being formed from only the third metallization layer 50, the first inductive element L1 is formed from both the second metallization layer 46 and the third metallization layer 50. Similarly, instead of being formed from only the second metallization layer 46, the second inductive element L2 is formed from both the second metallization layer 46 and the third metallization layer 50. Incorporating the layer swap arrangement 68 may help facilitate balancing losses between the first inductive element L1 and the second inductive element L2, balancing parasitic capacitances between the first inductive element L1 and the second inductive element L2, or both.

Figure 20:
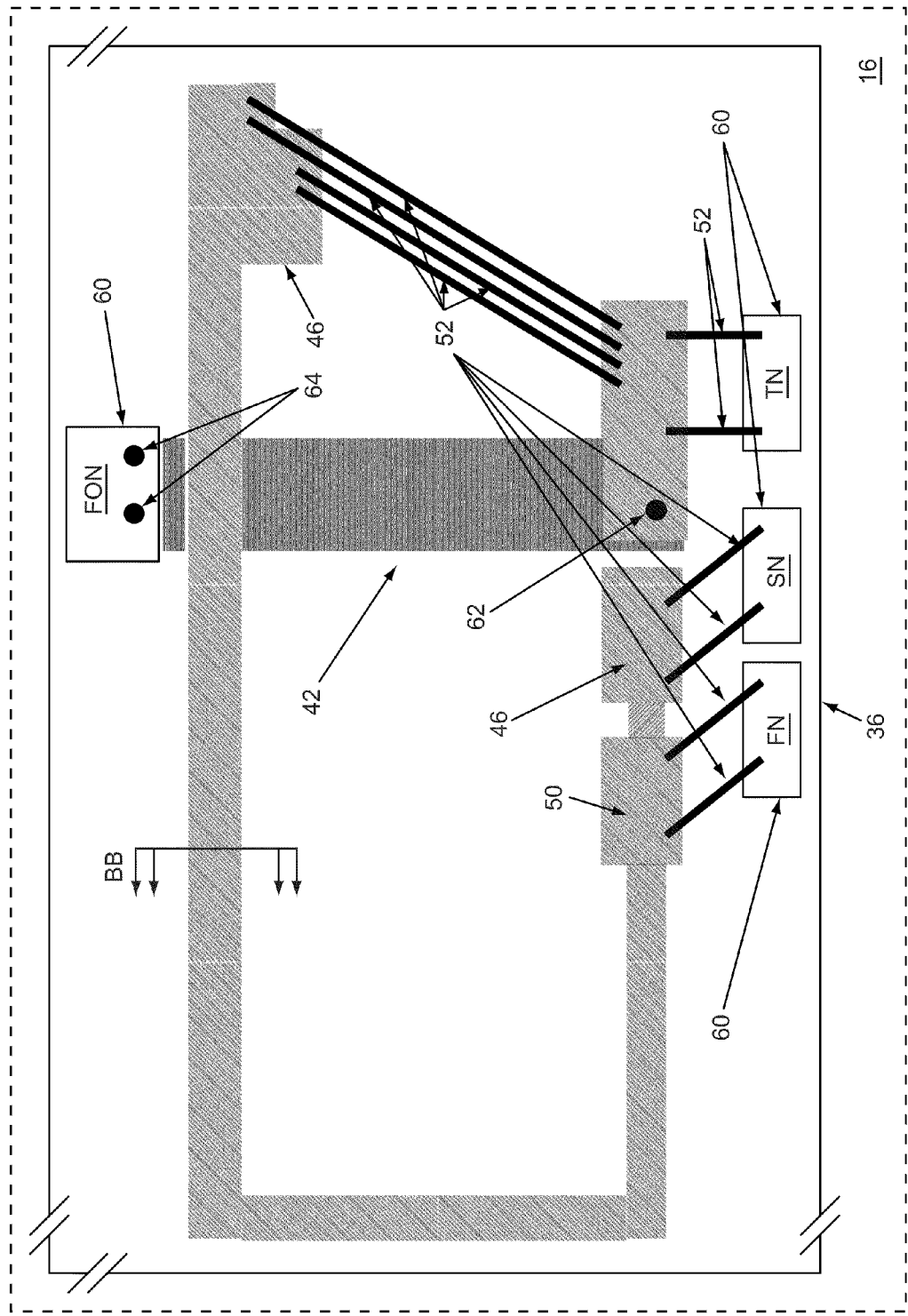
FIG. 20 shows a top view of construction details of the pair of magnetically coupled inductive elements illustrated in FIG. 17 according to another embodiment of the pair of magnetically coupled inductive elements.

FIG. 20 shows a top view of construction details of the pair of magnetically coupled inductive elements 16 illustrated in FIG. 17 according to another embodiment of the pair of magnetically coupled inductive elements 16. Both bonding wires 52 and the third metallization layer 50 are used to form the first inductive element L1. Similarly, both bonding wires 52 and the second metallization layer 46 are used to form the second inductive element L2. The magnetic cross-coupling between the first inductive element L1 and the second inductive element L2 provided by the proximity of the bonding wires 52 to one another, and the proximity of the conductive traces of the third metallization layer 50 and the second metallization layer 46 to one another.

Figure 21A:
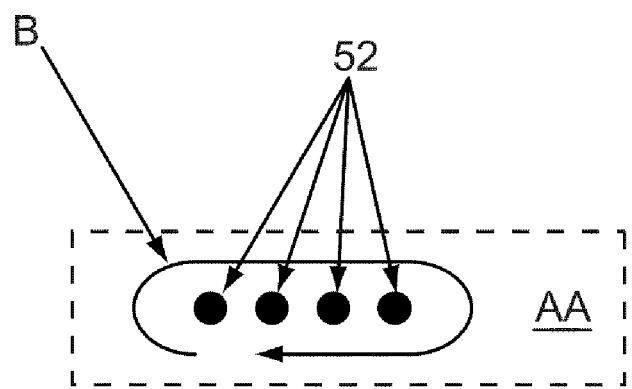
FIG. 21A shows a cross-section of the pair of magnetically coupled inductive elements illustrated in FIG. 16.

FIG. 21A shows the cross-section AA of the pair of magnetically coupled inductive elements 16 illustrated in FIG. 16. The cross-section AA shows the bonding wires 52 that are arranged to form the first inductive element L1 (not shown) and the second inductive element L2 (not shown). The bonding wires 52 share a common magnetic field B, which illustrates the magnetic cross-coupling between the first inductive element L1 and the second inductive element L2 provided by the proximity of the bonding wires 52 to one another.

Figure 21B:
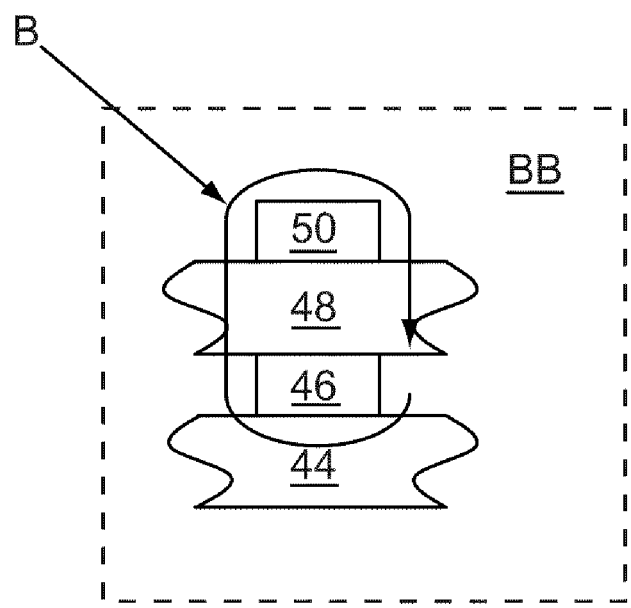
FIG. 21B shows a cross-section of the pair of magnetically coupled inductive elements illustrated in FIG. 18.

FIG. 21B shows the cross-section BB of the pair of magnetically coupled inductive elements 16 illustrated in FIG. 18. The third metallization layer 50 is used to form the first inductive element L1 and the second metallization layer 46 is used to form the second inductive element L2. Magnetic cross-coupling between the first inductive element L1 and the second inductive element L2 is provided by placing the conductive trace provided by the third metallization layer 50 directly over the conductive trace provided by the second metallization layer 46, such that the conductive traces share a common magnetic field B as illustrated in FIG. 21B.

Figure 22:
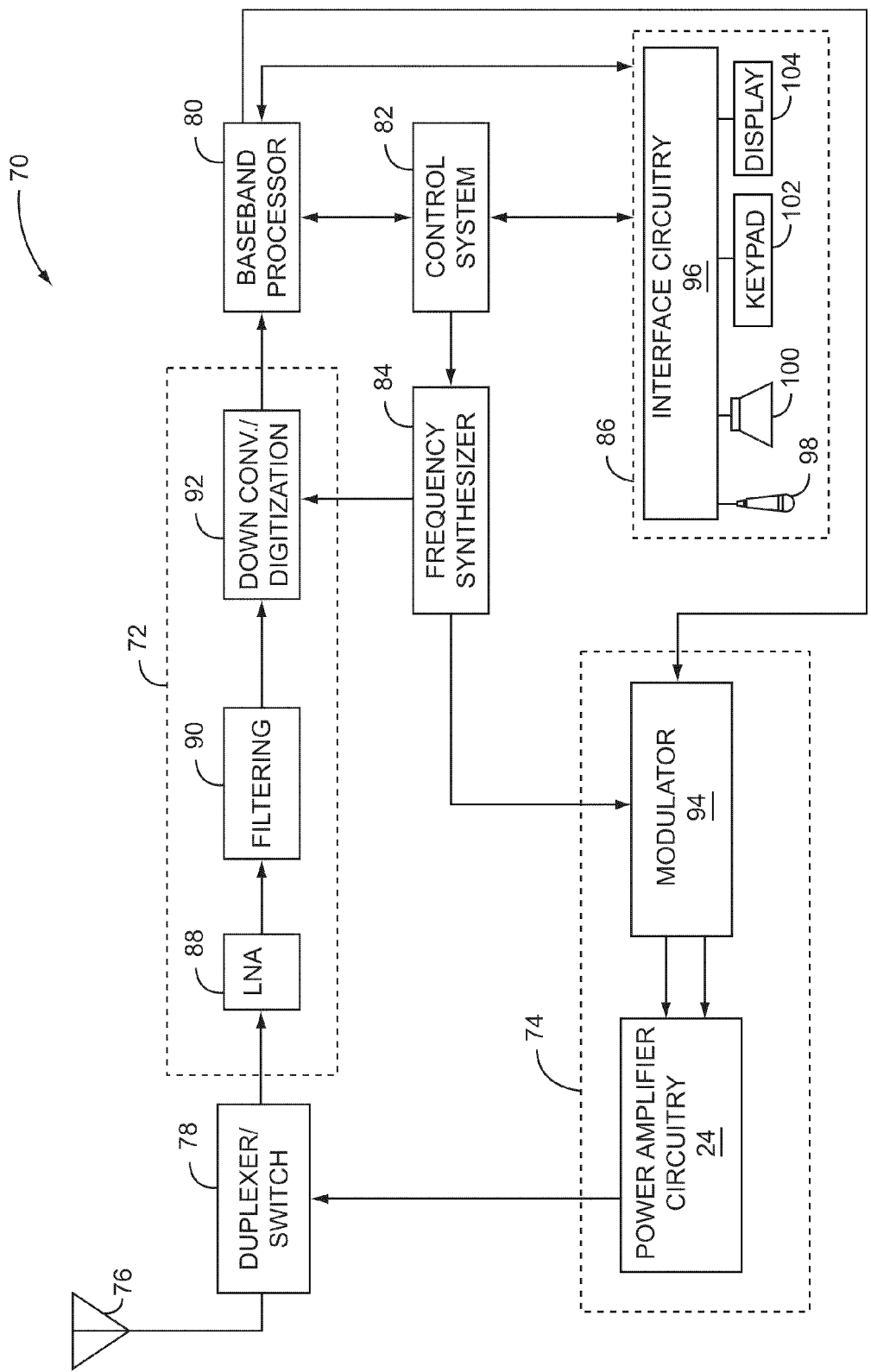
FIG. 22 shows an application example of the present invention used in a mobile terminal.

An application example of an RF power amplifier is its use in power amplifier circuitry 24 in a mobile terminal 70, the basic architecture of which is represented in FIG. 22. The mobile terminal 70 may include a receiver front end 72, a radio frequency transmitter section 74, an antenna 76, a duplexer or switch 78, a baseband processor 80, a control system 82, a frequency synthesizer 84, and an interface 86. The receiver front end 72 receives information bearing radio frequency signals from one or more remote transmitters provided by a base station (not shown). A low noise amplifier (LNA) 88 amplifies the signal. A filter circuit 90 minimizes broadband interference in the received signal, while down conversion and digitization circuitry 92 down converts the filtered, received signal to an intermediate or baseband frequency signal, which is then digitized into one or more digital streams. The receiver front end 72 typically uses one or more mixing frequencies generated by the frequency synthesizer 84. The baseband processor 80 processes the digitized received signal to extract the information or data bits conveyed in the received signal. This processing typically comprises demodulation, decoding, and error correction operations. As such, the baseband processor 80 is generally implemented in one or more digital signal processors (DSPs).

On the transmit side, the baseband processor 80 receives digitized data, which may represent voice, data, or control information, from the control system 82, which it encodes for transmission. The encoded data is output to the transmitter 74, where it is used by a modulator 94 to modulate two quadrature carrier signals that are both at a desired transmit frequency. The power amplifier circuitry 24 amplifies and combines the modulated carrier signals to a level appropriate for transmission, and delivers the amplified and modulated carrier signals to the antenna 76 through the duplexer or switch 78.

A user may interact with the mobile terminal 70 via the interface 86, which may include interface circuitry 96 associated with a microphone 98, a speaker 100, a keypad 102, and a display 104. The interface circuitry 96 typically includes analog-to-digital converters, digital-to-analog converters, amplifiers, and the like. Additionally, it may include a voice encoder/decoder, in which case it may communicate directly with the baseband processor 80. The microphone 98 will typically convert audio input, such as the user's voice, into an electrical signal, which is then digitized and passed directly or indirectly to the baseband processor 80. Audio information encoded in the received signal is recovered by the baseband processor 80, and converted by the interface circuitry 96 into an analog signal suitable for driving the speaker 100. The keypad 102 and display 104 enable the user to interact with the mobile terminal 70, input numbers to be dialed, address book information, or the like, as well as monitor call progress information. Some of the circuitry previously described may use discrete circuitry, integrated circuitry, or both.

Those skilled in the art will recognize improvements and modifications to the preferred embodiments of the present invention. All such improvements and modifications are considered within the scope of the concepts disclosed herein and the claims that follow.

What is claimed is:

1. A lumped cross-coupled Wilkinson circuit comprising:
   a pair of magnetically coupled inductive elements having a mutual inductance and comprising:
      a first inductive element coupled between a common port and a first port and having a first inductance; and
      a second inductive element coupled between the common port and a second port, magnetically cross-coupled to the first inductive element, and having a second inductance, such that the first inductive element and the second inductive element are aligned to have reinforcing mutually coupled magnetic flux, wherein a magnitude of the first inductance is about equal to a magnitude of the second inductance; and
   an isolation network coupled between the first port and the second port.

2. The lumped cross-coupled Wilkinson circuit of claim 1 further comprising an impedance matching network coupled between the common port and a reference.

3. The lumped cross-coupled Wilkinson circuit of claim 2 wherein:
   a coupling factor is associated with the first inductive element and the second inductive element and is about equal to a magnitude of the mutual inductance divided by the magnitude of the first inductance.

4. The lumped cross-coupled Wilkinson circuit of claim 3 wherein the coupling factor is greater than about 0.4.

5. The lumped cross-coupled Wilkinson circuit of claim 2 wherein:

the first port is adapted to receive a first alternating current (AC) signal;

the second port is adapted to receive a second AC signal; and the common port is adapted to provide a combined AC signal based on combining the first AC signal and the second AC signal, wherein the lumped cross-coupled Wilkinson circuit operates as a lumped cross-coupled Wilkinson combiner.

6. The lumped cross-coupled Wilkinson circuit of claim 5 wherein:

the first AC signal is based on an in-phase radio frequency (RF) signal;

the second AC signal is based on a quadrature-phase RF signal, which is nominally phase-shifted from the in-phase RF signal by about 90 degrees;

at least one of the in-phase RF signal and the quadrature-phase RF signal are phase-shifted to provide an approximately phase-aligned in-phase RF signal and quadrature-phase RF signal; and the combined AC signal is a combined RF signal based on combining the approximately phase-aligned in-phase RF signal and quadrature-phase RF signal.

7. The lumped cross-coupled Wilkinson circuit of claim 6 wherein:

the in-phase RF signal is provided by an in-phase RF power amplifier;

the quadrature-phase RF signal is provided by a quadrature-phase RF power amplifier; and the combined RF signal is an RF transmit signal.

8. The lumped cross-coupled Wilkinson circuit of claim 2 wherein:

the common port is adapted to receive a common alternating current (AC) signal;

the first port is adapted to provide a first AC signal based on splitting the common AC signal; and the second port is adapted to provide a second AC signal based on splitting the common AC signal, wherein the lumped cross-coupled Wilkinson circuit operates as a lumped cross-coupled Wilkinson splitter.

9. The lumped cross-coupled Wilkinson circuit of claim 8 wherein:

the common AC signal is a common RF signal;

an in-phase radio frequency (RF) signal is based on the first AC signal;

a quadrature-phase RF signal is based on the second AC signal;

at least one of the first AC signal and the second AC signal are phase-shifted to provide the in-phase RF signal and the quadrature-phase RF signal, such that the quadrature-phase RF signal is phase-shifted from the in-phase RF signal by approximately 90 degrees.

10. The lumped cross-coupled Wilkinson circuit of claim 2 wherein:

the lumped cross-coupled Wilkinson circuit presents a common impedance to the common port;

the lumped cross-coupled Wilkinson circuit presents a first impedance to the first port; and the lumped cross-coupled Wilkinson circuit presents a second impedance to the second port.

11. The lumped cross-coupled Wilkinson circuit of claim 10 wherein:

when a common external impedance having a magnitude about equal to a magnitude of the common impedance is presented to the common port;

when a first external impedance having a magnitude about equal to a magnitude of the first impedance is presented to the first port; and when a second external impedance having a magnitude about equal to a magnitude of the second impedance is presented to the second port, then the first port is about isolated from the second port.

12. The lumped cross-coupled Wilkinson circuit of claim 10 wherein:

a coupling factor is about equal to a magnitude of the mutual inductance divided by the magnitude of the first inductance; and a magnitude of the first impendence is about equal to a magnitude of the second impendence at an isolation frequency.

13. The lumped cross-coupled Wilkinson circuit of claim 12 wherein the magnitude of the first inductance is approximately defined by the following equation:

$$L_S = \frac{1}{\omega_0(1+K_X)} Z_L \sqrt{\frac{2Z_H}{Z_L} - 1},$$

where $L_S$ is the magnitude of the first inductance, $Z_H$ is a magnitude of the common impedance at the isolation frequency, $Z_L$ is the magnitude of the first impedance at the isolation frequency, $K_X$ is the coupling factor, and $\omega_o$ is a magnitude of the isolation frequency.

14. The lumped cross-coupled Wilkinson circuit of claim 12 wherein the impedance matching network comprises an impedance matching capacitive element coupled between the common port and the reference.

15. The lumped cross-coupled Wilkinson circuit of claim 14 wherein the impedance matching capacitive element has an impedance matching capacitance and a magnitude of the impedance matching capacitance is approximately defined by the following equation:

$$C_M = \frac{1}{\omega_0 Z_H} \sqrt{\frac{2Z_H}{Z_L} - 1},$$

where $Z_H$ is a magnitude of the common impedance at the isolation frequency, $Z_L$ is the magnitude of the first and the second impedances at the isolation frequency, $K_X$ is the coupling factor, $\omega_o$ is a magnitude of the isolation frequency, and $C_M$ is the magnitude of the impedance matching capacitance.

16. The lumped cross-coupled Wilkinson circuit of claim 12 wherein the isolation network comprises an isolation capacitive element and an isolation resistive element coupled in series between the first port and the second port.

17. The lumped cross-coupled Wilkinson circuit of claim 16 wherein the isolation capacitive element has an isolation capacitance and the isolation resistive element has an isolation resistance, such that a magnitude of the isolation capacitance and a magnitude of the isolation resistance are approximately defined by the following equations:

$$C_{iso} = \frac{1}{2(1-K_X)L_S} \left[ \frac{1}{\omega_0^2} + \frac{(1-K_X)^2 L_S^2}{Z_L^2} \right]$$

-continued $$R_{iso} = \frac{(1-K_X)L_S}{Z_L C_{iso}},$$

where $L_S$ is the magnitude of the first and the second inductances, $Z_H$ is the magnitude of the common impedance at the isolation frequency, $Z_L$ is the magnitude of the first and the second impedances at the isolation frequency, $K_X$ is the coupling factor, $\omega_o$ is a magnitude of the isolation frequency, $C_{iso}$ is the magnitude of the isolation capacitance, and $R_{iso}$ is the magnitude of the isolation resistance.

18. The lumped cross-coupled Wilkinson circuit of claim 2 wherein the isolation network is further coupled to the reference.

19. The lumped cross-coupled Wilkinson circuit of claim 2 wherein the reference is about ground.

20. The lumped cross-coupled Wilkinson circuit of claim 2 wherein the impedance matching network comprises an impedance matching capacitive element coupled between the common port and the reference.

21. A lumped cross-coupled Wilkinson circuit comprising:
a pair of magnetically coupled inductive elements having a mutual inductance and comprising:
   a first inductive element coupled between a common port and a first port and having a first inductance; and
   a second inductive element coupled between the common port and a second port, magnetically cross-coupled to the first inductive element, and having a second inductance, such that the first inductive element and the second inductive element are aligned to have reinforcing mutually coupled magnetic flux;
an isolation network coupled between the first port and the second port; and
an impedance network coupled between the common port and a reference, wherein the isolation network is further coupled to the reference.

22. A lumped cross-coupled Wilkinson circuit comprising:
a pair of magnetically coupled inductive elements having a mutual inductance and comprising:
   a first inductive element coupled between a common port and a first port and having a first inductance; and
   a second inductive element coupled between the common port and a second port, magnetically cross-coupled to the first inductive element, and having a second inductance, such that the first inductive element and the second inductive element are aligned to have reinforcing mutually coupled magnetic flux;
an isolation network coupled between the first port and the second port; and wherein:
the first port is adapted to receive a first alternating current (AC) signal;
the second port is adapted to receive a second AC signal; and
the common port is adapted to provide a combined AC signal based on combining the first AC signal and the second AC signal,
wherein the lumped cross-coupled Wilkinson circuit operates as a lumped cross-coupled Wilkinson combiner.

* * * * *